(12) United States Patent
Takekida

(10) Patent No.: US 11,908,520 B2
(45) Date of Patent: Feb. 20, 2024

(54) MEMORY DEVICE

(71) Applicant: Kioxia Corporation, Tokyo (JP)

(72) Inventor: Hideto Takekida, Nagoya Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 253 days.

(21) Appl. No.: 17/459,420

(22) Filed: Aug. 27, 2021

(65) Prior Publication Data

US 2022/0246213 A1    Aug. 4, 2022

(30) Foreign Application Priority Data

Feb. 3, 2021 (JP) .................................. 2021-015875

(51) Int. Cl.
| | |
|---|---|
| *G11C 16/16* | (2006.01) |
| *G11C 16/08* | (2006.01) |
| *G11C 16/26* | (2006.01) |
| *H01L 23/522* | (2006.01) |
| *H01L 23/528* | (2006.01) |
| *G11C 16/10* | (2006.01) |
| *H10B 43/10* | (2023.01) |
| *H10B 43/20* | (2023.01) |
| *H10B 43/35* | (2023.01) |
| *H10B 43/40* | (2023.01) |

(52) U.S. Cl.
CPC ............. *G11C 16/08* (2013.01); *G11C 16/10* (2013.01); *G11C 16/26* (2013.01); *H01L 23/5226* (2013.01); *H01L 23/5283* (2013.01); *H10B 43/10* (2023.02); *H10B 43/20* (2023.02); *H10B 43/35* (2023.02); *H10B 43/40* (2023.02)

(58) Field of Classification Search
CPC ....................................................... G11C 16/16
See application file for complete search history.

(56) References Cited

U.S. PATENT DOCUMENTS

| | | | |
|---|---|---|---|
| 10,074,667 | B1 | 9/2018 | Higashi et al. |
| 10,283,493 | B1 | 5/2019 | Nishida |
| 10,665,581 | B1 | 5/2020 | Zhou et al. |
| 2018/0261623 | A1 | 9/2018 | Higashi et al. |
| 2019/0043836 | A1 | 2/2019 | Fastow et al. |
| 2019/0312216 | A1* | 10/2019 | Kirsch .................. C07F 9/3808 |
| 2020/0266144 | A1 | 8/2020 | Ichikawa et al. |
| 2020/0357784 | A1 | 11/2020 | Park |
| 2021/0082878 | A1* | 3/2021 | Arai .................... H01L 25/0657 |

FOREIGN PATENT DOCUMENTS

| | | |
|---|---|---|
| JP | 2018-152419 A | 9/2018 |
| TW | I713198 B | 12/2020 |

* cited by examiner

*Primary Examiner* — Jason Lappas
(74) *Attorney, Agent, or Firm* — Foley & Lardner LLP

(57) ABSTRACT

According to one embodiment, a memory device includes a first chip and a second chip provided over the first chip. The first chip includes a first substrate, a first electrode, and a first memory cell array provided between the first substrate and the first electrode. The second chip includes a second substrate, a second electrode in contact with the first electrode, and a second memory cell array provided between the second substrate and the second electrode.

17 Claims, 23 Drawing Sheets

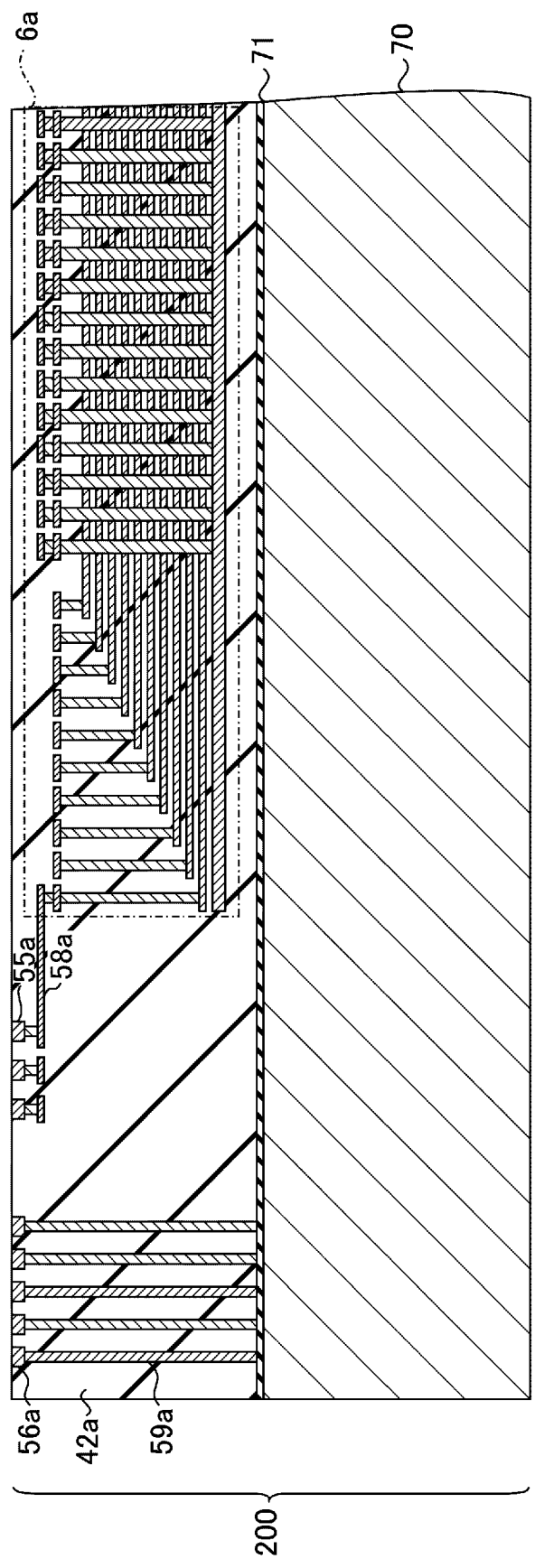
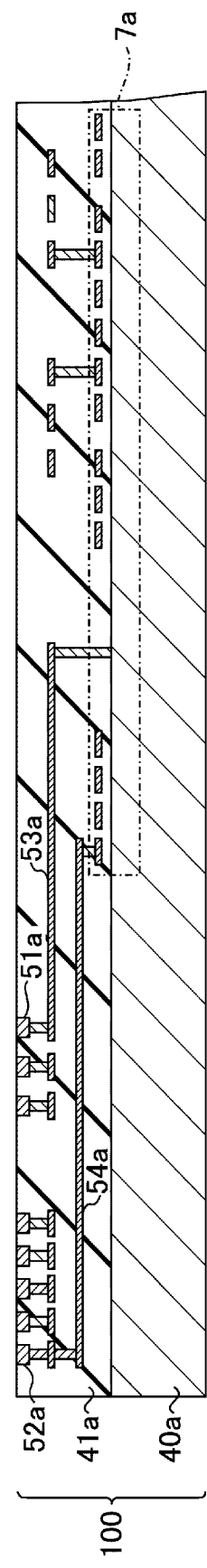
FIG. 10A
FIG. 10B

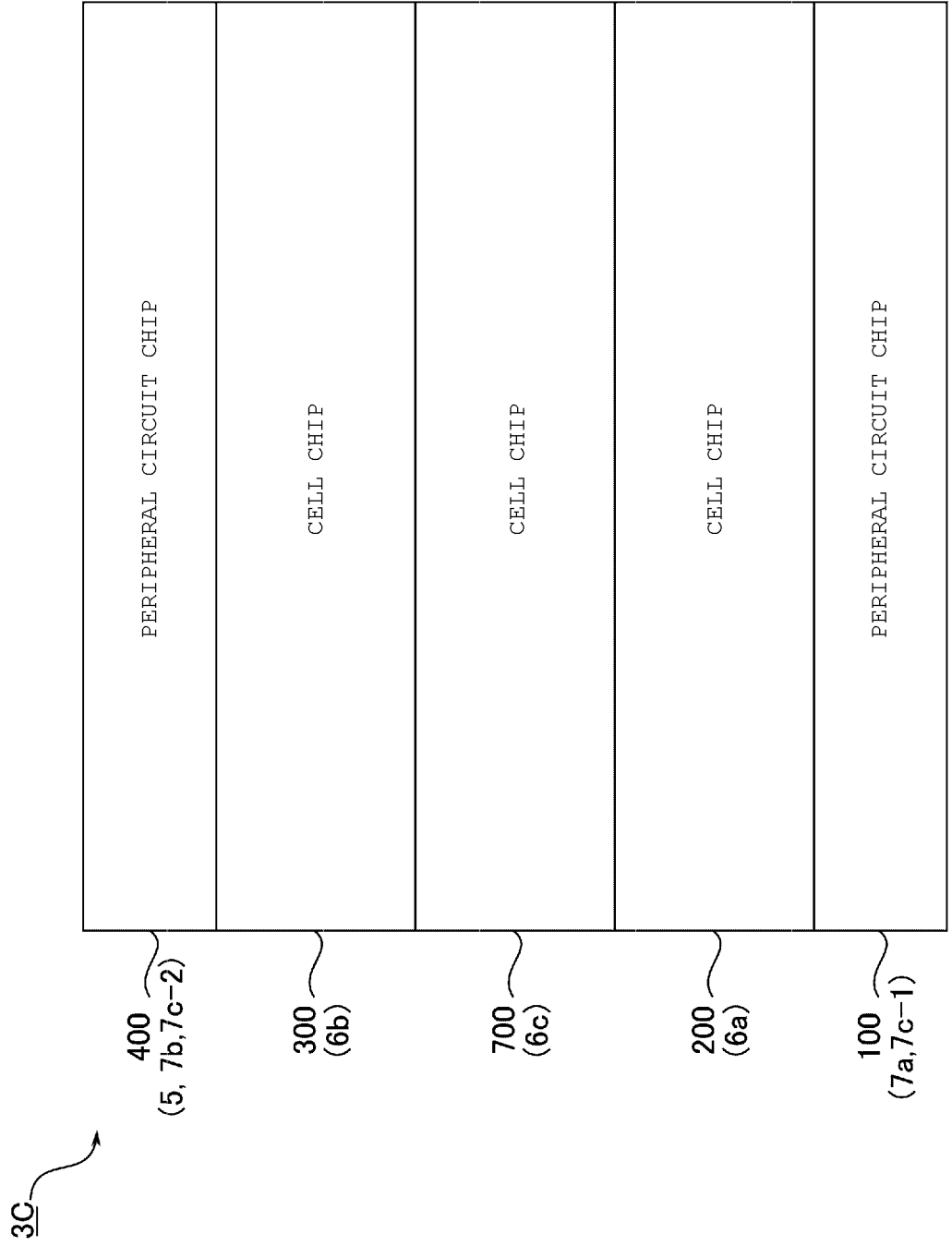

MEMORY DEVICE

CROSS-REFERENCE TO RELATED APPLICATION

This application is based upon and claims the benefit of priority from Japanese Patent Application No. 2021-015875, filed Feb. 3, 2021, the entire contents of which are incorporated herein by reference.

FIELD

Embodiments described herein relate generally to a memory device.

BACKGROUND

In general, a NAND flash memory can store data in a non-volatile manner. The NAND flash memory can be implemented as three-dimensional memory structure for high integration and large capacitance. A peripheral circuit for controlling the three-dimensional memory structure may be provided between a semiconductor substrate and the three-dimensional memory structure. A chip size of the memory device is proportionally determined by a larger size of the three-dimensional memory structure and the peripheral circuit.

DESCRIPTION OF THE DRAWINGS

FIGS. 10A and 10B are cross-sectional views illustrating a manufacturing step of the memory device according to the first embodiment.

FIG. 23 is a diagram illustrating an example of a bonding structure of a plurality of chips in a memory device according to a second modification example.

DETAILED DESCRIPTION

Figure 1:
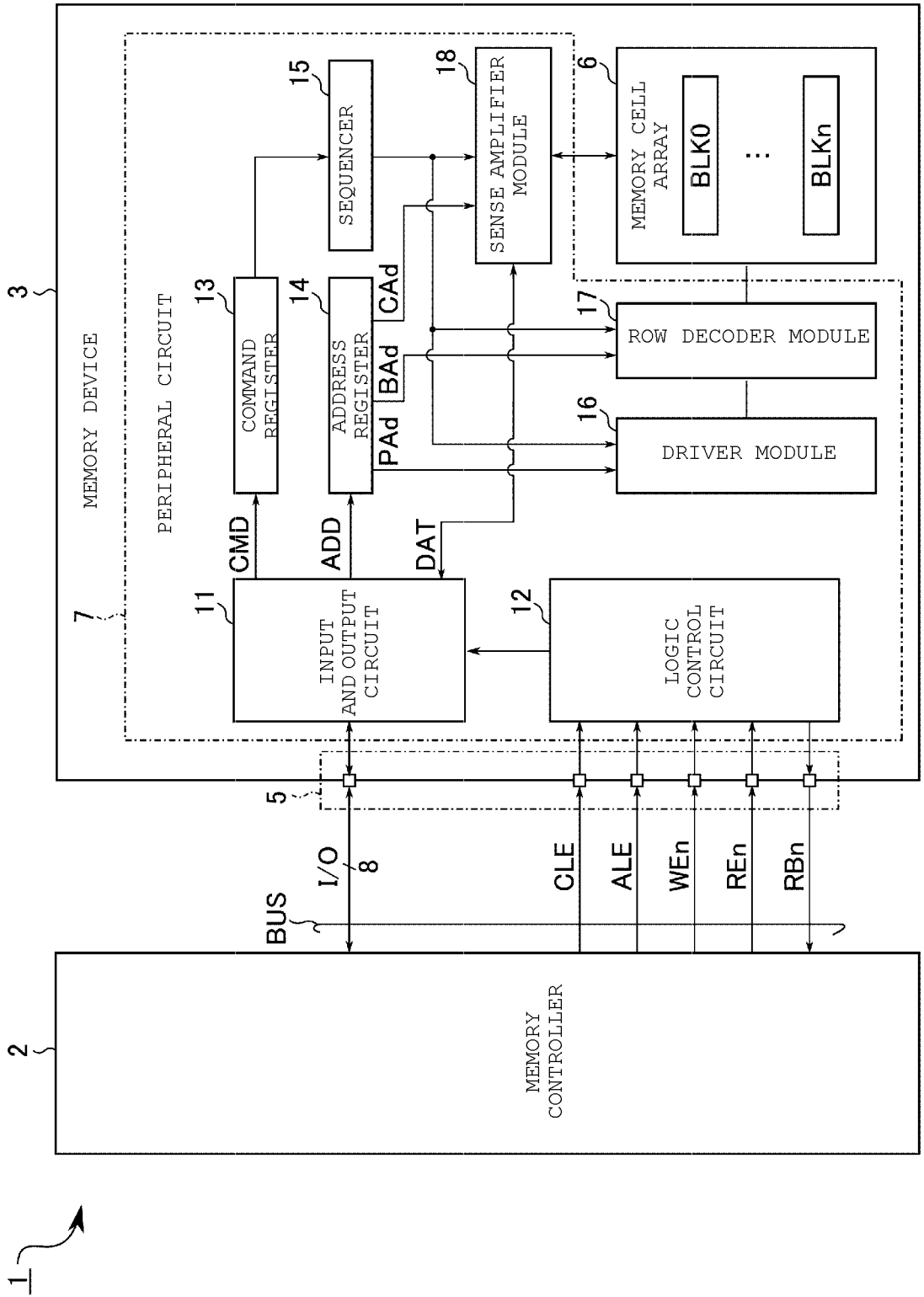
FIG. 1 is a block diagram illustrating a configuration of a memory system including a memory device according to a first embodiment.

Embodiments provide a memory device of which chip size is not proportionally determined by a size of a peripheral circuit.

In general, according to one embodiment, there is provided a memory device including a first chip and a second chip provided over the first chip. The first chip includes a first substrate, a first electrode, and a first memory cell array provided between the first substrate and the first electrode. The second chip includes a second substrate, a second electrode in contact with the first electrode, and a second memory cell array provided between the second substrate and the second electrode.

Hereinafter, embodiments will be described with reference to drawings. A dimension and a scale of the drawing are not always the same as the actual one.

Further, in the following description, components having substantially the same functions and configurations are denoted by the same reference numerals. When distinguishing elements having the same structure from each other, different characters or numbers may be added to an end of the same reference numeral.

1. First Embodiment

1.1 Configuration

1.1.1 Memory System

FIG. 1 is a block diagram illustrating a configuration of a memory system according to a first embodiment. A memory system 1 is a storage device configured to be connected to an external host device (not illustrated). The memory system 1 is, for example, a memory card such as an SD™ card, a universal flash storage (UFS), or a solid state drive (SSD). The memory system 1 includes a memory controller 2 and a memory device 3.

The memory controller 2 is configured with, for example, an integrated circuit such as a system-on-a-chip (SoC). The memory controller 2 controls the memory device 3 based on a request from the host device. Specifically, for example, the memory controller 2 writes data requested to be written by the host device, into the memory device 3. Further, the memory controller 2 reads data requested to be read from the host device from the memory device 3, and transmits the data to the host device.

The memory device 3 is a memory that stores the data in a non-volatile manner. The memory device 3 is, for example, a NAND flash memory. The memory device 3 is configured with a plurality of chips (not illustrated).

The memory controller 2 and the memory device 3 are connected by a bus BUS. The bus BUS is based on a single data rate (SDR) interface, a toggle double data rate (DDR) interface, or an open NAND flash interface (ONFI), for example.

A signal to be used in the bus BUS includes, for example, a command latch enable signal CLE, an address latch enable signal ALE, a write enable signal WEn, a read enable signal REn, a ready busy signal RBn, and an input and output signal I/O. As used herein, the n at an end of a name of the signal means that the signal is asserted when the signal is at a "Low (L)" level. In the following description, each of the command latch enable signal CLE, the address latch enable signal ALE, the write enable signal WEn, the read enable signal REn, the ready busy signal RBn, and the input and output signal I/O is also simply referred to as a signal.

The signals CLE and ALE are signals for notifying the memory device 3 that the signals I/O to the memory device 3 are respectively a command and an address.

The signal WEn is a signal for incorporating the signal I/O into the memory device 3.

The signal REn is a signal for reading the signal I/O from the memory device 3.

The signal RBn is a signal indicating whether the memory device 3 is in a ready state or a busy state. The ready state is a state in which the memory device 3 can receive an instruction from the memory controller 2. The busy state is a state in which the memory device 3 cannot receive the instruction from the memory controller 2. The signal RBn indicates that the "L" level is the busy state.

The signal I/O is, for example, an 8-bit signal. The signal I/O is data communicated between the memory device 3 and the memory controller 2. The signal I/O includes a command CMD, an address information ADD, and data DAT. The data DAT includes write data and read data.

1.1.2 Internal Configuration of Memory Device

Subsequently, an internal configuration of the memory device according to the first embodiment will be described with reference to the block diagram illustrated in FIG. 1.

The memory device 3 includes a pad group 5, a memory cell array 6, and a peripheral circuit 7.

The pad group 5 is a plurality of terminals (electrodes) provided on a front surface of the memory device 3. The pad group 5 is configured to be connected to the bus BUS. Thus, the memory device 3 may communicate with the memory controller 2 via the bus BUS.

The memory cell array 6 includes a plurality of blocks BLK0 to BLKn (n is an integer equal to or more than 1). Each block BLK is a set of a plurality of memory cells capable of storing data in a non-volatile manner, and is used, for example, as a data erasing unit. Further, the memory cell array 6 is provided with a plurality of bit lines and a plurality of word lines. Each memory cell is associated with, for example, one bit line and one word line. The detailed configuration of the memory cell array 6 will be described below.

The peripheral circuit 7 is a circuit for executing various operations on the memory cell array 6. The peripheral circuit 7 includes an input and output circuit 11, a logic control circuit 12, a command register 13, an address register 14, a sequencer 15, a driver module 16, a row decoder module 17, and a sense amplifier module 18.

The input and output circuit 11 communicates the signal I/O with the memory controller 2. When the signal I/O is received from the memory controller 2, the input and output circuit 11 distributes the signal I/O to the command CMD, the address information ADD, and the data DAT based on information from the logic control circuit 12. The input and output circuit 11 respectively transfers the command CMD to the command register 13 and the address information ADD to the address register 14. Further, the input and output circuit 11 communicates the data DAT with the sense amplifier module 18.

The logic control circuit 12 receives the signals CLE, ALE, WEn, and REn from the memory controller 2. The logic control circuit 12 sends out the information for identifying the command CMD, the address information ADD, and the data DAT in the signal I/O to the input and output circuit 11. In addition, the logic control circuit 12 transfers the signal RBn to the memory controller 2 to notify a state of the memory device 3 to the memory controller 2.

The command register 13 stores the command CMD from the input and output circuit 11. The command CMD includes, for example, an instruction for causing the sequencer 15 to execute a read operation, a write operation, an erasing operation, and the like.

The address register 14 stores the address information ADD from the input and output circuit 11. The address information ADD includes, for example, a block address BAd, a page address PAd, and a column address CAd. For example, the block address BAd, the page address PAd, and the column address CAd are respectively used to select the block BLK, the word line, and the bit line.

The sequencer 15 controls an operation of the entire memory device 3. For example, the sequencer 15 controls the driver module 16, the row decoder module 17, the sense amplifier module 18, and the like based on the command CMD stored in the command register 13, and executes a read operation, a write operation, an erasing operation, and the like.

The driver module 16 generates a voltage used in the read operation, the write operation, the erasing operation, or the like. The driver module 16 applies the generated voltage to a signal line corresponding to the selected word line based on, for example, the page address PAd stored in the address register 14.

The row decoder module 17 selects one block BLK in the corresponding memory cell array 6, based on the block address BAd stored in the address register 14. The row decoder module transfers the voltage applied to the signal line corresponding to the selected word line, to the selected word line in the selected block BLK, for example.

In the write operation, the sense amplifier module 18 applies a desired voltage to each bit line, according to write data received from the memory controller 2. Further, in the read operation, the sense amplifier module 18 determines data stored in the memory cell based on the voltage of the bit line, and transfers the determination result as read data to the memory controller 2.

1.1.3 Circuit Configuration of Memory Cell Array

Figure 2:
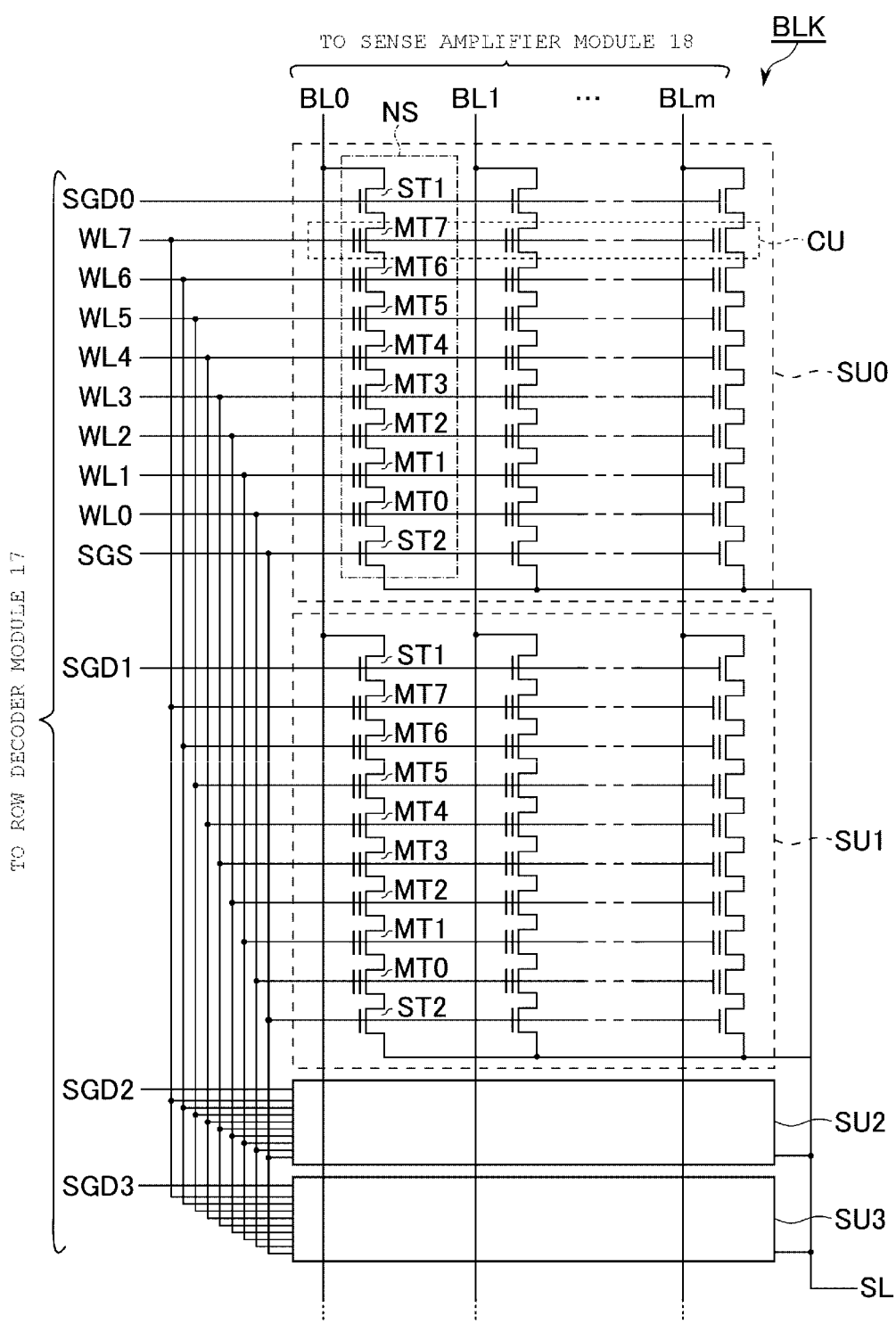
FIG. 2 is a circuit diagram illustrating an example of a structure of a memory cell array of the memory device according to the first embodiment.

Next, a configuration of a memory cell array provided in the memory device according to the first embodiment will be described. FIG. 2 is an example of a circuit diagram illustrating a configuration of the memory cell array of the memory device according to the first embodiment. In FIG. 2, one block BLK of the memory cell array 6 is extracted and illustrated. As illustrated in FIG. 2, the block BLK includes, for example, four string units SU0 to SU3.

Each string unit SU includes a plurality of NAND strings NS associated with bit lines BL0 to BLm (m is an integer equal to or more than 2). The NAND string NS includes, for example, memory cell transistor MT0 to MT7, and select transistors ST1 and ST2.

The memory cell transistor MT includes a control gate and a charge storage film, and stores data in a non-volatile manner. Each of the select transistors ST1 and ST2 is used to select the string unit SU during various operations.

In each NAND string NS, the memory cell transistor MT0 to MT7 are connected in series. The select transistor ST1 is connected between one end of the memory cell transistor MT0 to MT7 connected in series and the associated bit line BL. The select transistor ST2 is connected between the other end of the memory cell transistor MT0 to MT7 connected in series and a source line SL.

In the same block BLK, respective gates of a plurality of select transistors ST1 in the string unit SU0 to SU3 are commonly connected to select gate lines SGD0 to SGD3. Respective control gates of a plurality of memory cell transistors MT0 to MT7 are commonly connected to the word lines WL0 to WL7. Each gate of a plurality of select transistors ST2 is commonly connected to a select gate line SGS. A voltage is applied to the select gate lines SGD0 to SGD3 and SGS, and the word lines WL0 to WL7 via the row decoder module 17.

The bit lines BL0 to BLm are shared among the plurality of blocks BLK. The same bit line BL is connected to the NAND string NS corresponding to the same column address. Each of the word lines WL0 to WL7 is provided for each block BLK. The source line SL is shared among, for example, the plurality of blocks BLK. A voltage is applied to the bit lines BL0 to BLm via the sense amplifier module 18.

A set of the plurality of memory cell transistor MT connected to the common word line WL in one string unit SU is referred to as a cell unit CU, for example, and is used as a write unit for data. For example, a storage capacitance of the cell unit CU including the memory cell transistor MT, each of which stores 1-bit data, is defined as "1-page data". The 1-page data is used, for example, as a read unit for data. The cell unit CU may have a storage capacitance of two-page data or more depending on the number of bits of the data stored in the memory cell transistor MT.

Further, a circuit configuration of the memory cell array 6 described above is merely an example, and is not limited thereto. For example, the number of string unit SU in each block BLK may be freely designed. The number of each of the memory cell transistor MT and the select transistors ST1 and ST2 in each NAND string NS may be freely designed.

1.1.4 Bonding Structure of Memory Device

Figure 3:
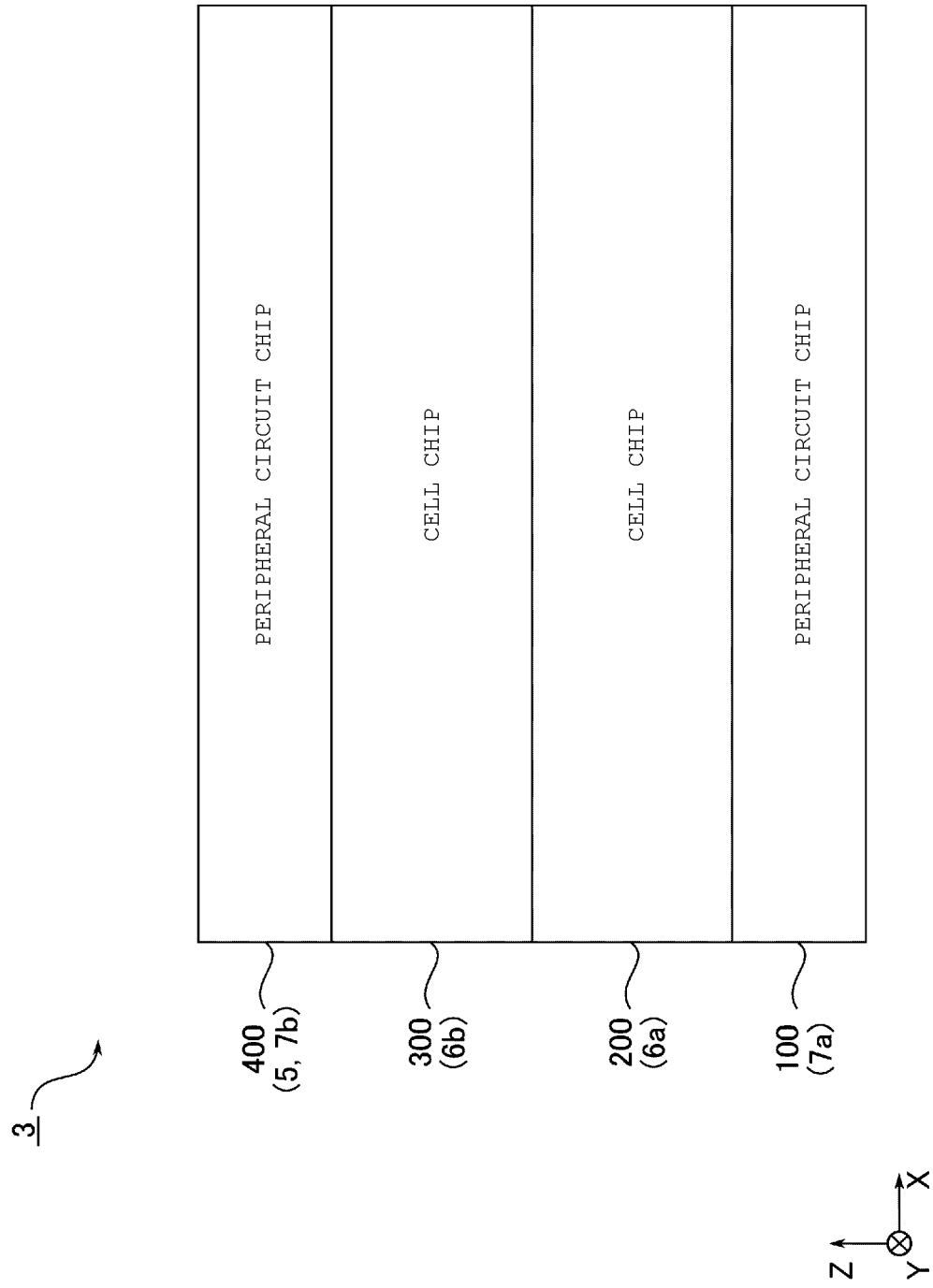
FIG. 3 is a diagram illustrating an example of a bonding structure of a plurality of chips in the memory device according to the first embodiment.

FIG. 3 is a diagram illustrating an example of a bonding structure of a plurality of chips in the memory device according to the first embodiment. As illustrated in FIG. 3, the memory device 3 is bonded so that four chips are stacked.

Specifically, the memory device 3 includes peripheral circuit chips 100 and 400, and cell chips 200 and 300. Although the peripheral circuit chips 100 and 400 and cell chips 200 and 300 are illustrated as discrete components, it should be appreciated that two or more of the chips 100 to 400 may be integrated as (and thus referred to as) a single chip while remaining within the scope of present disclosure. Memory cell arrays 6a and 6b are respectively formed in the cell chips 200 and 300. A peripheral circuit 7a corresponding to the memory cell array 6a is formed on the peripheral circuit chip 100. In the peripheral circuit chip 400, a pad group 5 is formed, in addition to the peripheral circuit 7b corresponding to the memory cell array 6b. Each of the peripheral circuit 7a and 7b may include the input and output circuit 11, the logic control circuit 12, the command register 13, the address register 14, the sequencer 15, the driver module 16, the row decoder module 17, and the sense amplifier module 18.

Each of the peripheral circuit chip 100, the cell chip 200, the cell chip 300, and the peripheral circuit chip 400 has a first surface and a second surface facing each other.

The first surface of the peripheral circuit chip 100 is not in contact with any of the chips. The second surface of the peripheral circuit chip 100 and the first surface of the cell chip 200 are in contact with each other by being bonded to each other. The second surface of the cell chip 200 and the first surface of the cell chip 300 are in contact with each other by being bonded to each other. The second surface of the cell chip 300 and the first surface of the peripheral circuit chip 400 are in contact with each other by being bonded to each other. The second surface of the peripheral circuit chip 400 is not in contact with any of the chips.

In the following, when each of the peripheral circuit chip 100, the cell chip 200, the cell chip 300, and the peripheral circuit chip 400 is not particularly distinguished, the peripheral circuit chip 100, the cell chip 200, the cell chip 300, and the peripheral circuit chip 400 may be simply referred to as "chips". Further, stack surfaces (a bonding surface or a joining surface) of the peripheral circuit chip 100, the cell chip 200, the cell chip 300, and the peripheral circuit chip 400 are referred to as an "XY plane" or simply a "plane(s)". Two directions intersecting with each other in the XY plane are referred to as an "X-direction" and a "Y-direction". A stack direction from the peripheral circuit chip 100 to the peripheral circuit chip 400 is referred to as a "Z-direction".

1.1.5 Planar Layout of Memory Device

Figure 4:
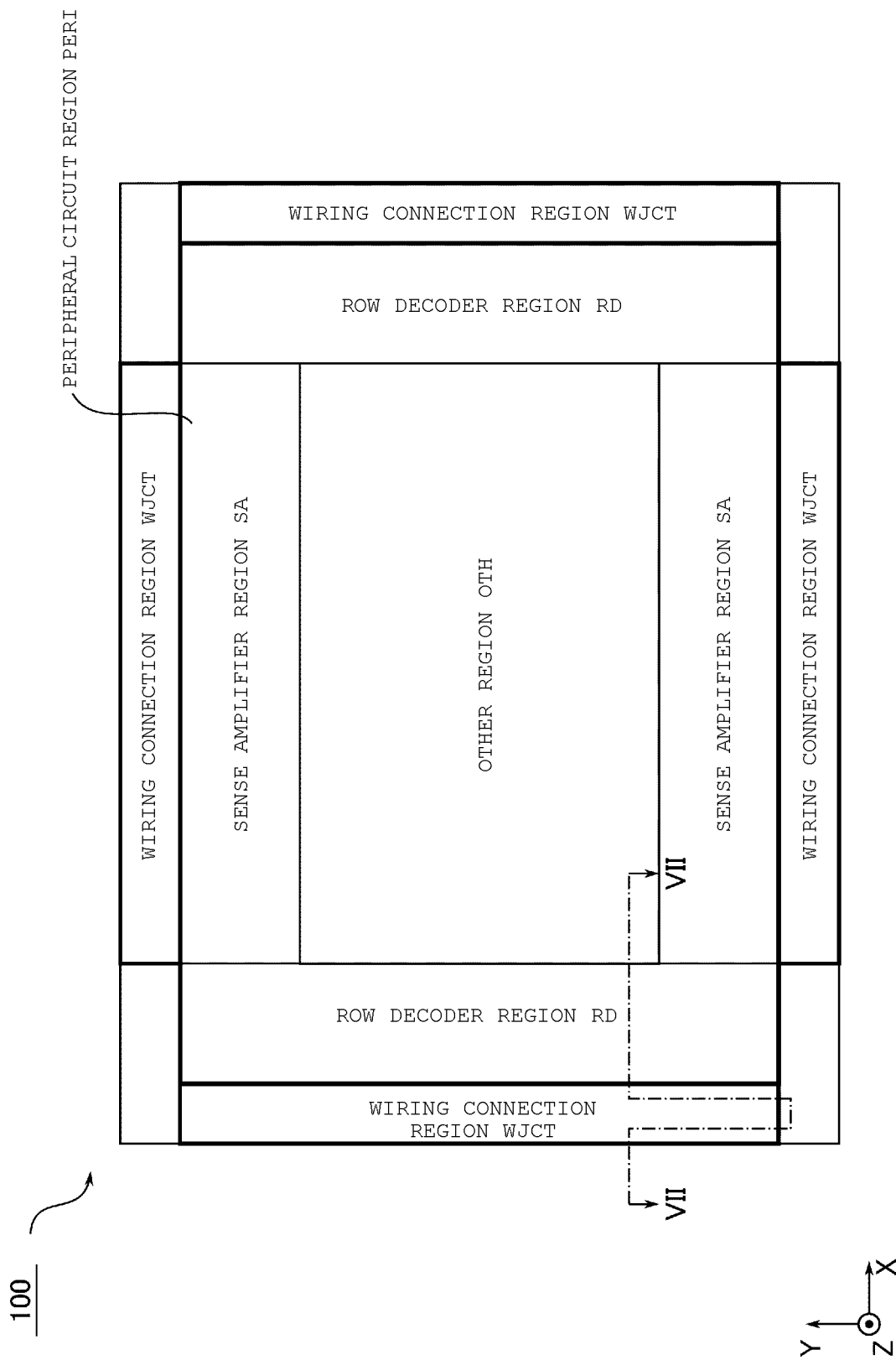
FIG. 4 is a diagram illustrating an example of a planar layout in one of two peripheral circuit chips in the memory device according to the first embodiment.
Figure 5:
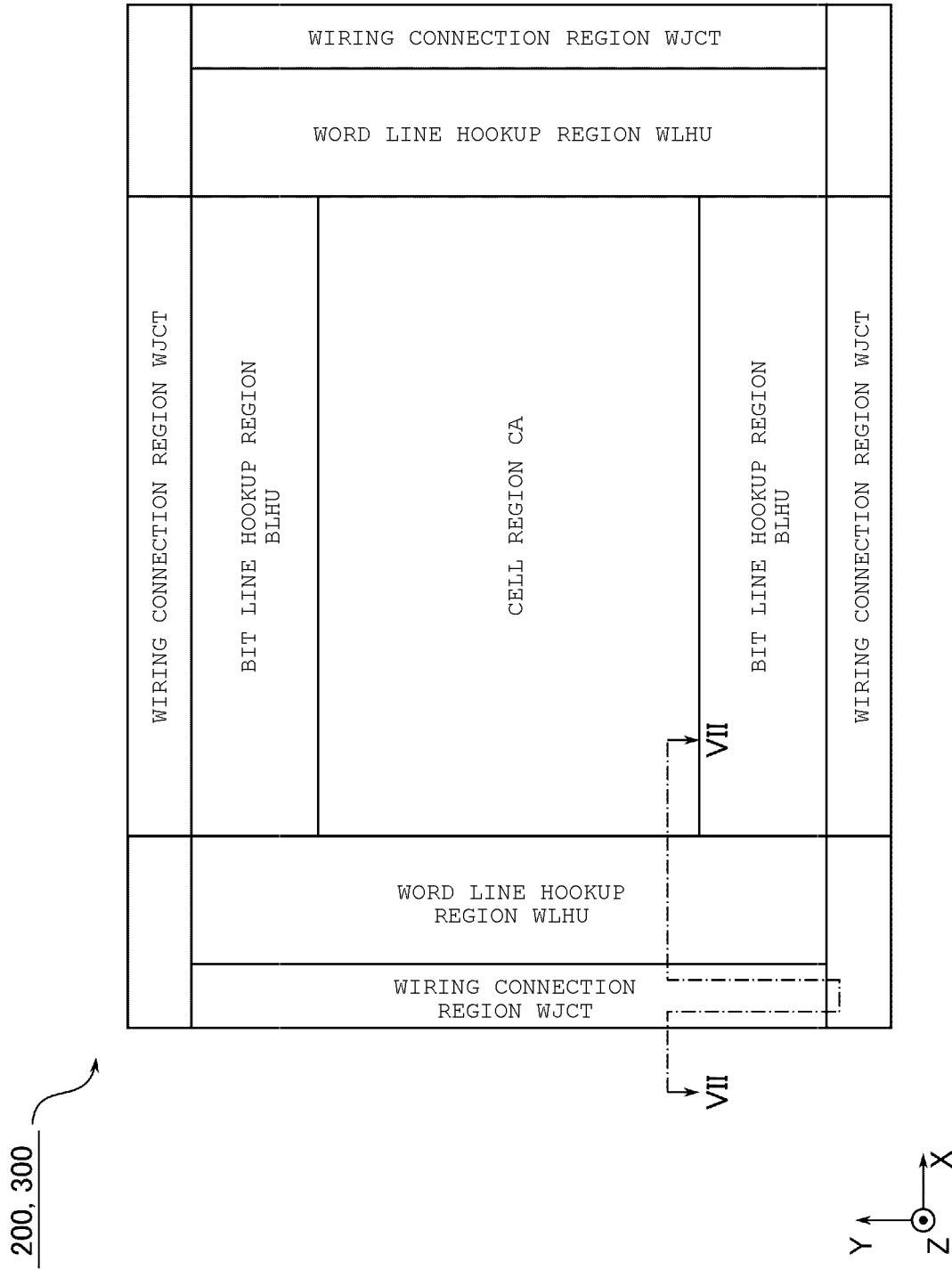
FIG. 5 is a diagram illustrating an example of a planar layout of a cell chip of the memory device according to the first embodiment.
Figure 6:
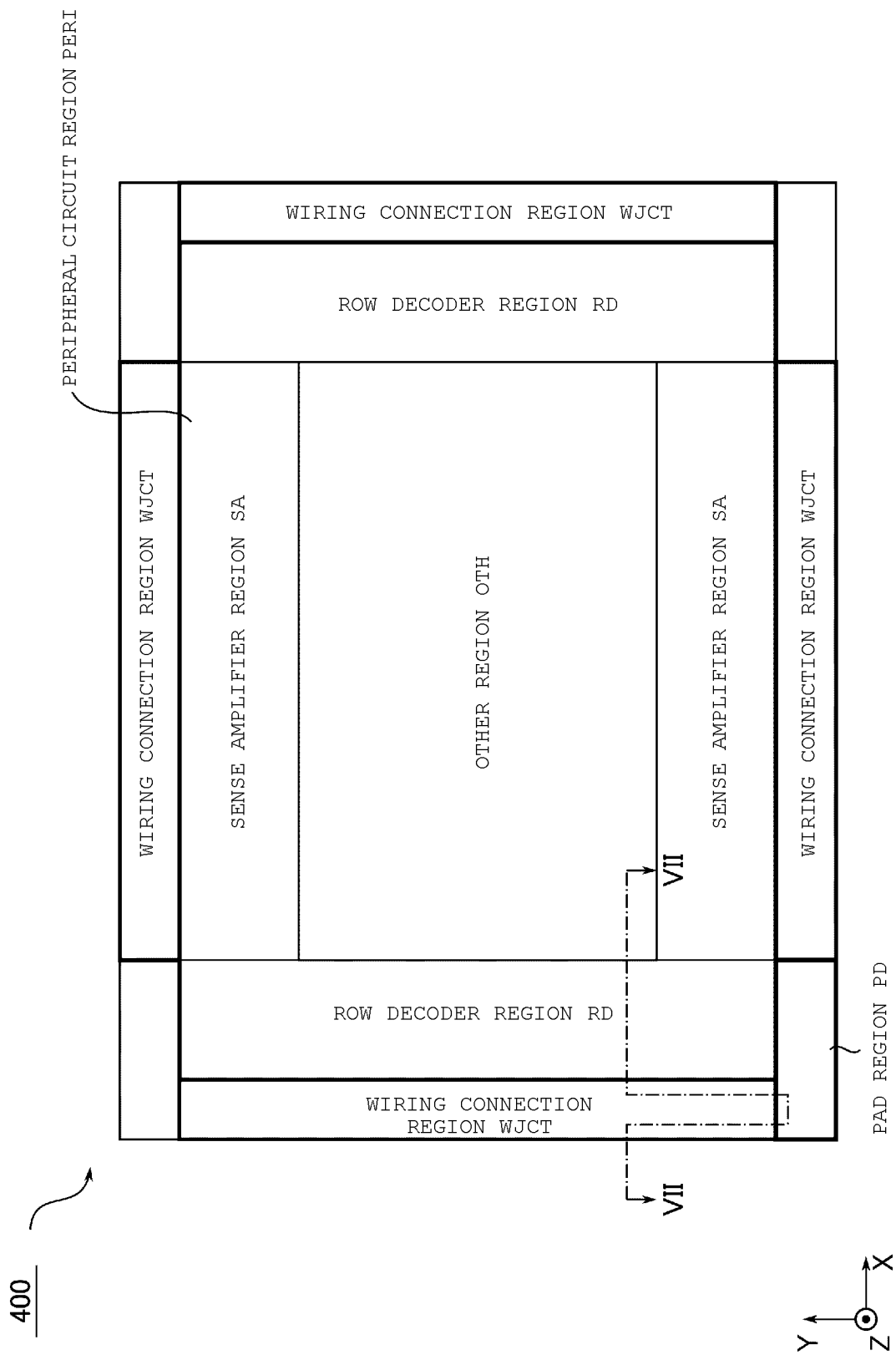
FIG. 6 is a diagram illustrating an example of a planar layout of the other of the two peripheral circuit chips in the memory device according to the first embodiment.

FIGS. 4 to 6 are diagrams illustrating examples of planar layouts of the memory device according to the first embodiment. FIG. 4 illustrates a planar layout of the peripheral circuit chip 100. FIG. 5 illustrates a planar layout of the cell chips 200 and 300. FIG. 6 illustrates a planar layout of the peripheral circuit chip 400.

First, the planar layout of the peripheral circuit chip 100 will be described with reference to FIG. 4.

As illustrated in FIG. 4, the peripheral circuit chip 100 has, for example, a peripheral circuit region PERI and four wiring connection regions WJCT in the XY plane.

The peripheral circuit 7 is formed at the peripheral circuit region PERI. The peripheral circuit region PERI is disposed at a center portion of the peripheral circuit chip 100.

The wiring connection region WJCT is a region in which a wiring for electrically connecting the chip (the peripheral circuit chip 100 in the example in FIG. 4) and the chip in contact with the chip (the cell chip 200 in the example in FIG. 4) is formed. Two of the four wiring connection regions WJCT sandwich the peripheral circuit region PERI along the X-direction. The remaining two of the four wiring connection regions WJCT sandwich the peripheral circuit region PERI along the Y-direction.

The peripheral circuit region PERI has, for example, two row decoder regions RD, two sense amplifier regions SA, and another region OTH.

The other region OTH is a region in which the input and output circuit 11, the logic control circuit 12, the command register 13, the address register 14, the sequencer 15, the driver module 16, and the like are formed. The other region OTH is disposed at a center portion of the peripheral circuit region PERI.

The sense amplifier region SA is a region in which the sense amplifier module 18 is formed. The two sense amplifier regions SA sandwich the other region OTH along the Y-direction.

The row decoder region RD is a region in which the row decoder module 17 is formed. The two row decoder regions RD sandwich the other region OTH and the two sense amplifier regions SA along the X-direction.

Next, the planar layout of the cell chips 200 and 300 will be described with reference to FIG. 5.

As illustrated in FIG. 5, the peripheral circuit chip 100 has, for example, a cell region CA, two bit line hookup regions BLHU, two word line hookup regions WLHU, and four wiring connection regions WJCT in the XY plane.

The cell region CA is a region in which the memory cell array 6 is formed. The cell region CA is disposed at a center portion of each of the cell chips 200 and 300.

The word line hookup region WLHU is a region in which a word line is drawn from the memory cell array 6. The two word line hookup regions WLHU sandwich the cell region CA and the two bit line hookup regions BLHU along the X-direction.

The bit line hookup region BLHU is a region in which bit lines are drawn from the memory cell array 6. The two bit line hookup regions BLHU sandwich the cell region CA along the Y-direction.

Two of the four wiring connection regions WJCT sandwich the two word line hookup regions WLHU along the X-direction. The remaining two of the four wiring connection regions WJCT sandwich the two bit line hookup regions BLHU along the Y-direction.

Next, the planar layout of the peripheral circuit chip 400 will be described with reference to FIG. 6.

As illustrated in FIG. 6, the peripheral circuit chip 400 has, for example, a peripheral circuit region PERI, four wiring connection regions WJCT, and a pad region PD in the XY plane. Among the peripheral circuit region PERI, the four wiring connection regions WJCT, and the pad region PD, arrangement of the peripheral circuit region PERI and the four wiring connection regions WJCT is equivalent to the peripheral circuit chip 100, and thus the description thereof will not be repeated.

The pad region PD is a region in which the pad group 5 is formed. The pad region PD is disposed outside the peripheral circuit region PERI and the four wiring connection regions WJCT in the XY plane.

Further, the planar layout illustrated in FIGS. 4 to 6 is merely an example, and a planar layout of the memory device 3 is not limited to this. For example, the word line hookup region WLHU, the bit line hookup region BLHU, and the wiring connection region WJCT may be provided inside the cell region CA.

1.1.6 Cross-Sectional Structure of Memory Device

Figure 7:
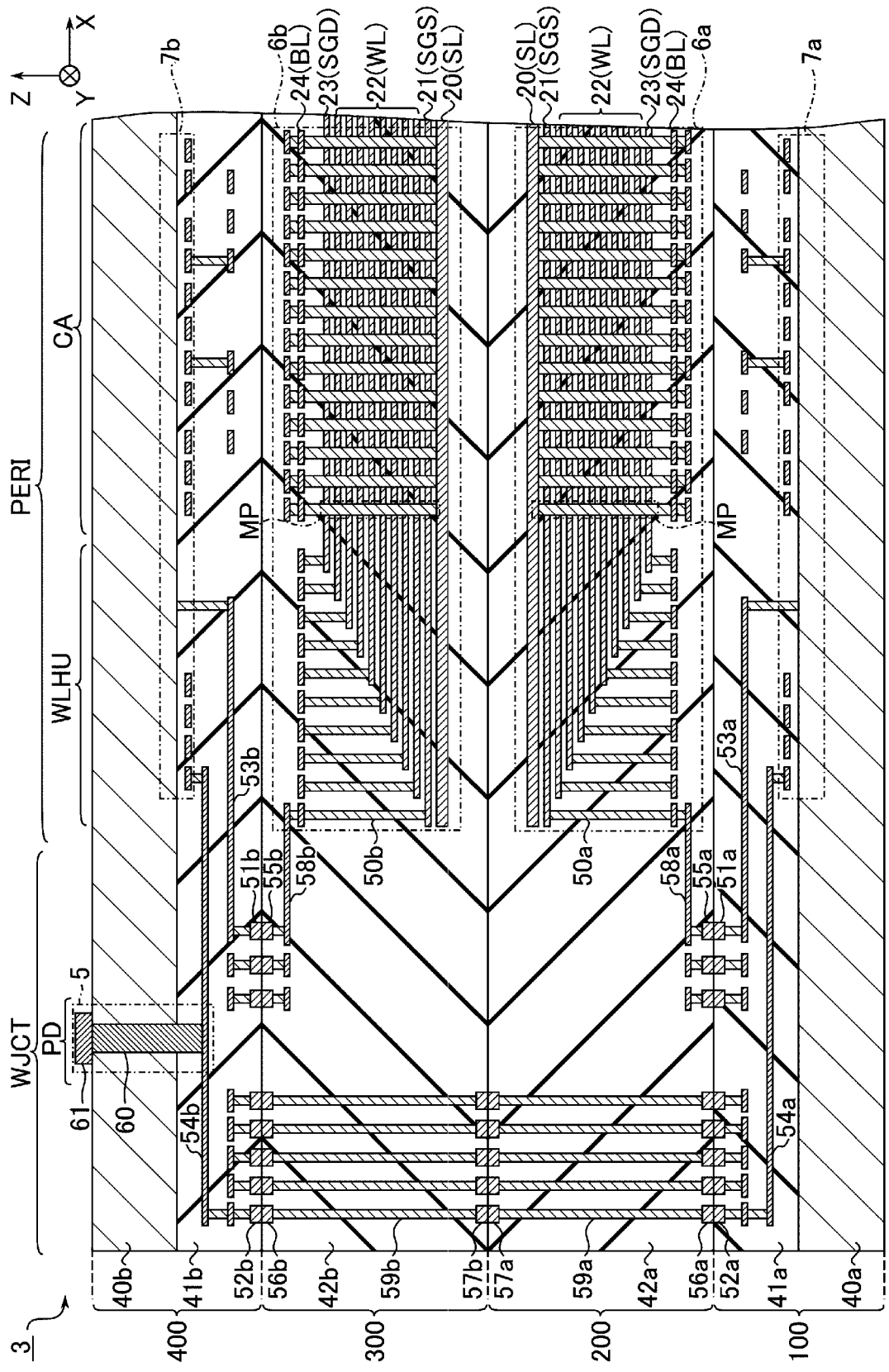
FIG. 7 is a cross-sectional view taken along the line VII-VII in FIGS. 4 to 6 illustrating an example of a structure of the memory device according to the first embodiment.

FIG. 7 is a cross-sectional view taken along the line VII-VII in FIGS. 4 to 6 illustrating an example of a structure of the memory device according to the first embodiment. In the example in FIG. 7, an XZ cross section of the memory device 3 including the wiring connection region WJCT, the pad region PD, the peripheral circuit region PERI, the word line hookup region WLHU, and the cell region CA is illustrated.

First, a connection configuration between the chips 100 to 400 will be described.

As illustrated in FIG. 7, the peripheral circuit chip 100 includes a semiconductor substrate 40a and an insulator layer 41a. Each of the semiconductor substrate 40a and the insulator layer 41a has a first surface and a second surface facing each other along the Z-direction. The first surface of the semiconductor substrate 40a corresponds to the first surface of the peripheral circuit chip 100. The second surface of the semiconductor substrate 40a and the first surface of the insulator layer 41a are in contact with each other. The second surface of the insulator layer 41a corresponds to the second surface of the peripheral circuit chip 100.

The peripheral circuit 7a is formed in a boundary region between the semiconductor substrate 40a and the insulator layer 41a. Electrodes 51a and 52a are provided on the second surface of the insulator layer 41a. For example, the row decoder module 17 in the peripheral circuit 7a is electrically connected to the electrode 51a via a wiring layer 53a. Further, for example, the input and output circuit 11 or the logic control circuit 12 in the peripheral circuit 7a is electrically connected to the electrode 52a via a wiring layer 54a.

The cell chip 200 includes an insulator layer 42a. A first surface and a second surface of the insulator layer 42a facing each other along the Z-direction respectively correspond to the first surface and the second surface of the cell chip 200. The memory cell array 6a is formed in the insulator layer 42a. Electrodes 55a and 56a are provided on the first surface of the insulator layer 42a. An electrode 57a is provided on the second surface of the insulator layer 42a. For example, the memory cell array 6a is electrically connected to the electrode 55a via a wiring layer 58a. Further, for example, the electrode 56a is electrically connected to the electrode 57a via a wiring layer 59a.

The cell chip 300 includes an insulator layer 42b. A first surface and a second surface of the insulator layer 42b facing each other along the Z-direction respectively correspond to the first surface and the second surface of the cell chip 300. The memory cell array 6b is formed in the insulator layer 42b. An electrode 57b is provided on the first surface of the insulator layer 42b. Electrodes 55b and 56b are provided on the second surface of the insulator layer 42b. For example, the memory cell array 6b is electrically connected to the electrode 55b via a wiring layer 58b. Further, for example, the electrode 57b is electrically connected to the electrode 56b via a wiring layer 59b.

The peripheral circuit chip 400 includes a semiconductor substrate 40b and an insulator layer 41b. The semiconductor substrate 40b has a thickness equivalent to a thickness of the semiconductor substrate 40a along the Z-direction. Each of the semiconductor substrate 40b and the insulator layer 41b has a first surface and a second surface facing each other in the Z-direction. The first surface of the insulator layer 41b corresponds to the first surface of the peripheral circuit chip 400. The second surface of the insulator layer 41b and the first surface of the semiconductor substrate 40b are in contact with each other. The second surface of the semiconductor substrate 40b corresponds to the second surface of the peripheral circuit chip 400.

The peripheral circuit 7b is formed in a boundary region between the semiconductor substrate 40b and the insulator layer 41b. Electrodes 51b and 52b are provided on the first surface of the insulator layer 41b. For example, the row decoder module 17 in the peripheral circuit 7b is electrically connected to the electrode 51b via a wiring layer 53b. Further, for example, the input and output circuit 11 or the logic control circuit 12 in the peripheral circuit 7b is electrically connected to the electrode 52b via a wiring layer 54b.

An electrode 61 is provided on the second surface of the semiconductor substrate 40b. For example, the electrode 61 is electrically connected to the wiring layer 54b via a contact 60 that penetrates through the semiconductor substrate 40b. The contact 60 and the electrode 61 constitute one of the pad groups 5.

The electrodes 51a, 52a, 55a to 57a, 51b, 52b, and 55b to 57b, and the wiring layers 53a, 54a, 58a, 59a, 53b, 54b, 58b, and 59b include, for example, copper or a copper alloy containing copper as a main component. The contact 60 includes, for example, copper or a copper alloy containing copper as a main component. The electrode 61 contains, for example, aluminum.

The second surface of the insulator layer 41a and the first surface of the insulator layer 42a are bonded so that the corresponding electrodes are in contact with each other. In the example in FIG. 7, the second surface of the insulator layer 41a and the first surface of the insulator layer 42a are bonded so that the electrodes 51a and 55a are in contact with each other and the electrodes 52a and 56a are in contact with each other.

The second surface of the insulator layer 42a and the first surface of the insulator layer 42b are bonded so that the corresponding electrodes are in contact with each other. In the example in FIG. 7, the second surface of the insulator layer 42a and the first surface of the insulator layer 42b are bonded so that the electrodes 57a and 57b are in contact with each other.

The second surface of the insulator layer 42b and the first surface of the insulator layer 41b are bonded so that the corresponding electrodes are in contact with each other. In the example in FIG. 7, the second surface of the insulator layer 42b and the first surface of the insulator layer 41b are bonded so that the electrodes 55b and 51b are in contact with each other and the electrodes 56b and 52b are in contact with each other.

With the configuration described above, the memory device 3 may transmit various signals received from the pad group 5, to the peripheral circuit 7a and 7b. The peripheral circuit 7a and 7b may respectively supply desired voltages to the memory cell arrays 6a and 6b, based on the various signals received from the pad group 5.

1.1.7 Structure of Memory Cell Array

Next, a configuration of the memory cell array 6 will be described with reference to FIG. 7. In the following, the configuration of the memory cell array 6b will be described. That is, in FIG. 7, an upward direction on page corresponds to the Z-direction. Further, the memory cell array 6a is equivalent to the memory cell array 6b formed in the opposite direction along the Z-direction, so the description thereof will not be repeated.

For example, conductor layers 20 to 24 are provided in the insulator layer 42b.

The conductor layer 20 is formed in a plate shape extending along the XY plane, for example, and is used as the source line SL. The conductor layer 20 contains, for example, silicon.

The conductor layer 21 is provided above the conductor layer 20 via an insulator layer. The conductor layer 21 is used as the select gate line SGS.

A plurality of insulator layers and conductor layers 22 are alternately stacked above the conductor layer 21. The conductor layers 22 are respectively used as the word lines WL0 to WL7, in order from the conductor layer 20 side, for example.

The conductor layer 23 is provided above the conductor layer 22 stacked on the uppermost layer, via an insulator layer (not illustrated). The conductor layer 23 is used as the select gate line SGD.

The conductor layers 21 to 23 are formed in a plate shape extending along the XY plane, for example, and contain tungsten (W), for example.

A plurality of conductor layers 24 are provided above the conductor layer 23 via an insulator layer (not illustrated). For example, the conductor layer 24 extends along the Y-direction. The plurality of conductor layers 24 are arranged along the X-direction. Each of the plurality of conductor layers 24 is used as the bit line BL. The conductor layer 24 contains, for example, copper (Cu).

In the following description, the conductor layers 20 to 24 are also collectively referred to as "stack wiring".

Each of the conductor layers 21 to 23 is drawn by a contact extending along the Z-direction and then electrically connected to the corresponding peripheral circuit 7 via the wiring connection region WJCT. In FIG. 7, as an example, the case where the conductor layer 21 is electrically connected to the electrode 55a via a contact 50a is illustrated. Thus, the peripheral circuit 7a may apply a desired voltage to each of the select gate line SGD, the plurality of word line WL, and the select gate line SGS in the memory cell array 6a. Further, the peripheral circuit 7b may supply a desired voltage to each of the select gate line SGD, the plurality of word line WL, and the select gate line SGS in the memory cell array 6b.

Further, although not illustrated in FIG. 7, in the bit line hookup region BLHU, the conductor layer 24 is drawn by a contact (not illustrated) extending along the Z-direction, and then is electrically connected to the corresponding peripheral circuit via a wiring connection region (not illustrated). Thus, the peripheral circuit 7a may supply a desired voltage to the bit line BL in the memory cell array 6a. Further, the peripheral circuit 7b may supply a desired voltage to the bit line BL in the memory cell array 6b.

Further, in the cell region CA, the memory cell arrays 6a and 6b have a plurality of memory pillars MP. Each of the plurality of memory pillars MPs penetrates through the select gate line SGD, the plurality of word line WL, and the select gate line SGS, and reaches the source line SL. Each of the plurality of memory pillar MPs is configured to electrically connect between the bit line BL corresponding to each of the plurality of memory pillar MPs and the source line SL. An intersection portion of the memory pillar MP and the word line functions as one memory cell transistor.

1.1.7 Memory Pillar and Stack Wiring

Figure 8:
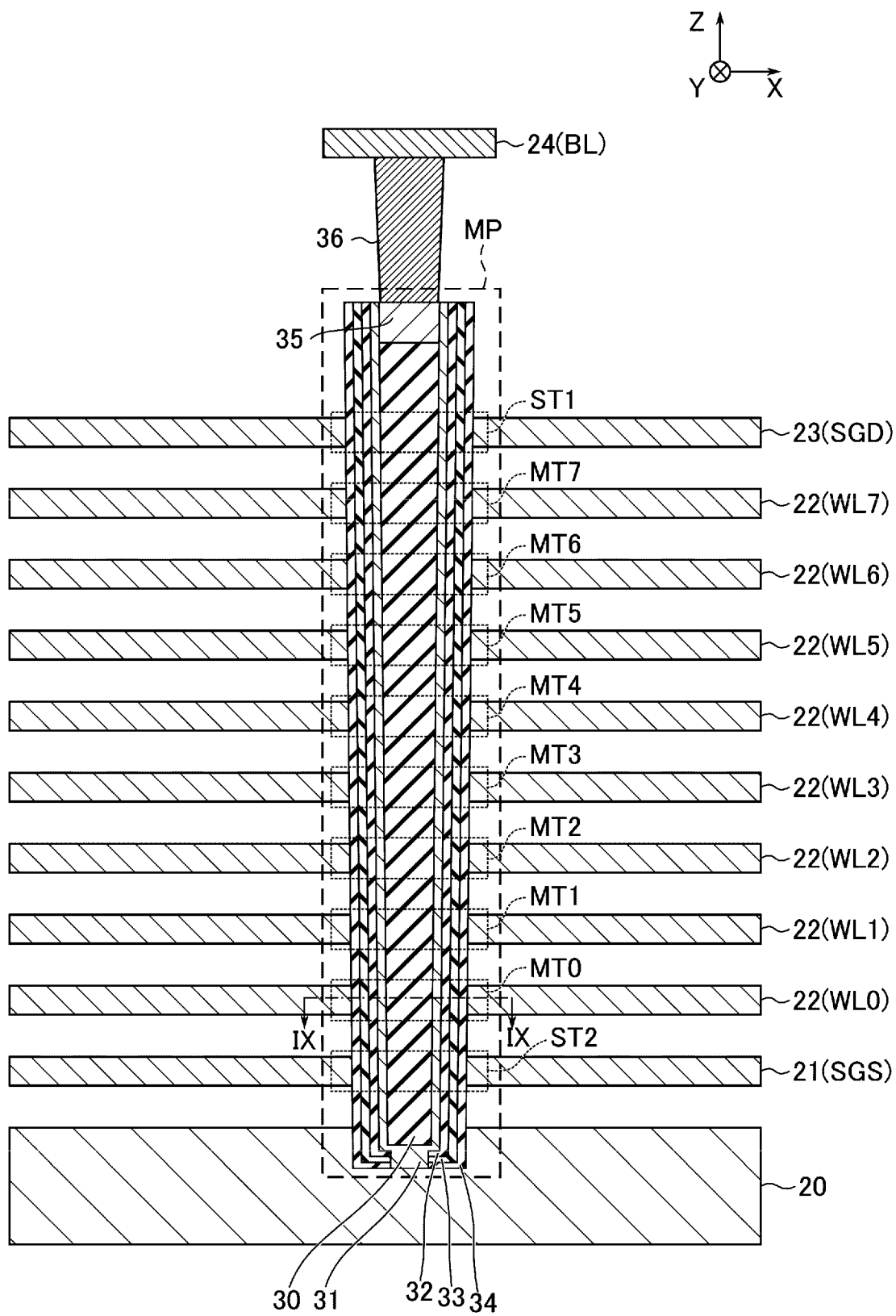
FIG. 8 is a cross-sectional view illustrating an example of a configuration of a memory pillar of the memory device according to the first embodiment.

FIG. 8 is a cross-sectional view illustrating an example of a configuration of the memory pillar and the stack wiring of the memory device according to the first embodiment. In FIG. 8, as an example, the memory pillar MP formed at the memory cell array 6b in FIG. 7 is illustrated. That is, in FIG. 8, an upward direction on page corresponds to the Z-direction.

As illustrated in FIG. 8, the memory pillar MP extends along the Z-direction, penetrates through the conductor layers 21 to 23, and has a bottom portion in contact with the conductor layer 20. The memory pillar MP includes, for example, a core film 30, a semiconductor film 31, a tunnel insulating film 32, a charge storage film 33, a block insulating film 34, and a semiconductor unit 35.

The core film 30 extends along the Z-direction, and an upper end of the core film 30 is located above, for example, the uppermost conductor layer 23. A lower end of the core film 30 is located in the conductor layer 20. The core film 30 contains an insulator such as silicon oxide ($SiO_2$), for example.

The semiconductor film 31 covers a bottom surface and a side surface of the core film 30. A lower end of the semiconductor film 31 is in contact with the conductor layer 21, and an upper end of the semiconductor film 31 is located above the uppermost conductor layer 23. The semiconductor film 31 contains, for example, polysilicon.

The tunnel insulating film 32 covers a side surface of the semiconductor film 31. The tunnel insulating film 32 contains, for example, silicon oxide.

The charge storage film 33 covers a side surface of the tunnel insulating film 32. The charge storage film 33 contains, for example, silicon nitride (SiN).

The block insulating film 34 covers a side surface of the charge storage film 33. The block insulating film 34 contains, for example, silicon oxide.

The semiconductor unit 35 covers an upper surface of the core film 30, and is in contact with an inner wall of a portion of the semiconductor film 31 provided above the core film 30. The semiconductor unit 35 is provided, for example in a columnar shape, and reaches an upper end of the memory pillars MP.

A contact 36 is provided on an upper surface of the memory pillar MP. An upper surface of the contact 36 is in contact with the conductor layer 24. Thus, the memory pillars MP is configured to electrically connect the conductor layer 20 and the conductor layer 24.

Figure 9:
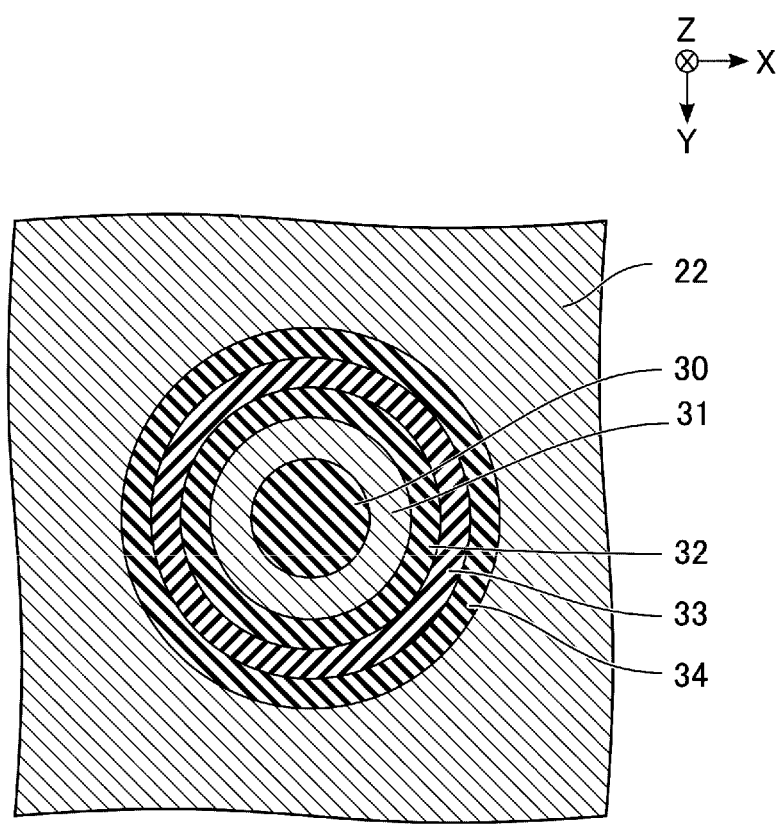
FIG. 9 is a cross-sectional view taken along the line IX-IX in FIG. 8 illustrating an example of a structure of a memory cell transistor according to the first embodiment.

FIG. 9 is a cross-sectional view taken along the line IX-IX of the memory pillar MP in FIG. 8. FIG. 9 illustrates an example of a cross-sectional structure including the memory pillar MP and the conductor layer 22 around the memory pillar MP.

As illustrated in FIG. 9, the core film 30 is provided approximately at a center of the memory pillar MP. Further, the semiconductor film 31, the tunnel insulating film 32, the charge storage film 33, and the block insulating film 34 are concentrically provided in the periphery of the core film 30. The conductor layer 22 covers the periphery of the block insulating film 34.

In the structure described above, a portion at which the memory pillar MP and the conductor layer 21 intersect with each other functions as the select transistor ST2. A portion at which the memory pillar MP and the conductor layer 22 intersect with each other functions as the memory cell transistor MT0 to MT7. A portion at which the memory pillar MP and the conductor layer 23 intersect with each other functions as the select transistor ST1.

That is, the semiconductor film 31 is used as each channel of the memory cell transistor MT and the select transistors ST1 and ST2. Thus, each of the memory pillar MPs functions as, for example, one NAND string NS.

Further, the structure of the memory cell array 6 described above is merely an example, and the memory cell array 6 may have another structure. For example, the number of conductor layers 22 is designed based on the number of word line WL. A plurality of conductor layers 21 and 23 provided in a plurality of layers may be respectively assigned to the select gate lines SGS and SGD. When the select gate line SGS is provided in a plurality of layers, a conductor made of a material different from a material of the conductor layer 21 may be used. The memory pillar MP and the conductor layer 24 may be electrically connected via two or more contacts, or may be electrically connected via another wiring.

1.2 Manufacturing Method

Hereinafter, an example of a series of manufacturing steps of the memory device according to the first embodiment will be described. Each in FIGS. 10 to 14 illustrates an example of a cross-sectional structure including a structure corresponding to a memory cell array in the manufacturing step of the memory device according to the first embodiment. It is noted that a cross section corresponding to the cross section of the memory device 3 illustrated in FIG. 7 is provided in the cross-sectional view of the manufacturing step to be referred to below.

First, as illustrated in FIG. 10B, the peripheral circuit chip 100 is formed. Specifically, the peripheral circuit 7a including a transistor or the like is formed on the semiconductor substrate 40a. The peripheral circuit 7a is covered with the insulator layer 41a. A plurality of electrodes including the electrodes 51a and 52a are formed so as to be exposed on the insulator layer 41a. It is noted that a plurality of wiring layers, including the wiring layers 53a and 54a, that electrically connect the plurality of electrodes including the electrodes 51a and 52a and the peripheral circuit 7a are formed, in the insulator layer 41a. Further, although not illustrated in FIG. 10B, in parallel with the formation of the peripheral circuit chip 100, by a step equivalent to the peripheral circuit chip 100, the peripheral circuit chip 400 may be formed.

Further, concurrently with manufacturing the peripheral circuit chip 100, the cell chip 200 is formed as illustrated in FIG. 10A. Specifically, an insulator layer 71 is formed as a buffer layer on the substrate 70. The insulator layer 71 contains, for example, silicon oxide. The memory cell array 6a is formed above the insulator layer 71. The memory cell array 6a is covered with the insulator layer 42a. A plurality of electrodes including the electrodes 55a and 56a are formed so as to be exposed on the insulator layer 42a. It is noted that a plurality of wiring layers, including the wiring layer 58a, that electrically connects a plurality of electrodes including the electrodes 55a and the memory cell array 6a are formed, in the insulator layer 42a. In addition, a plurality of wiring layers, including the wiring layer 59a, that physically connects a plurality of electrodes including the electrode 56a and the insulator layer 71 are formed, in the insulator layer 42a. Further, although not illustrated in FIG. 10A, the cell chip 300 may be formed in parallel with the formation of the cell chip 200 by a step equivalent to the cell chip 200.

Figure 11:
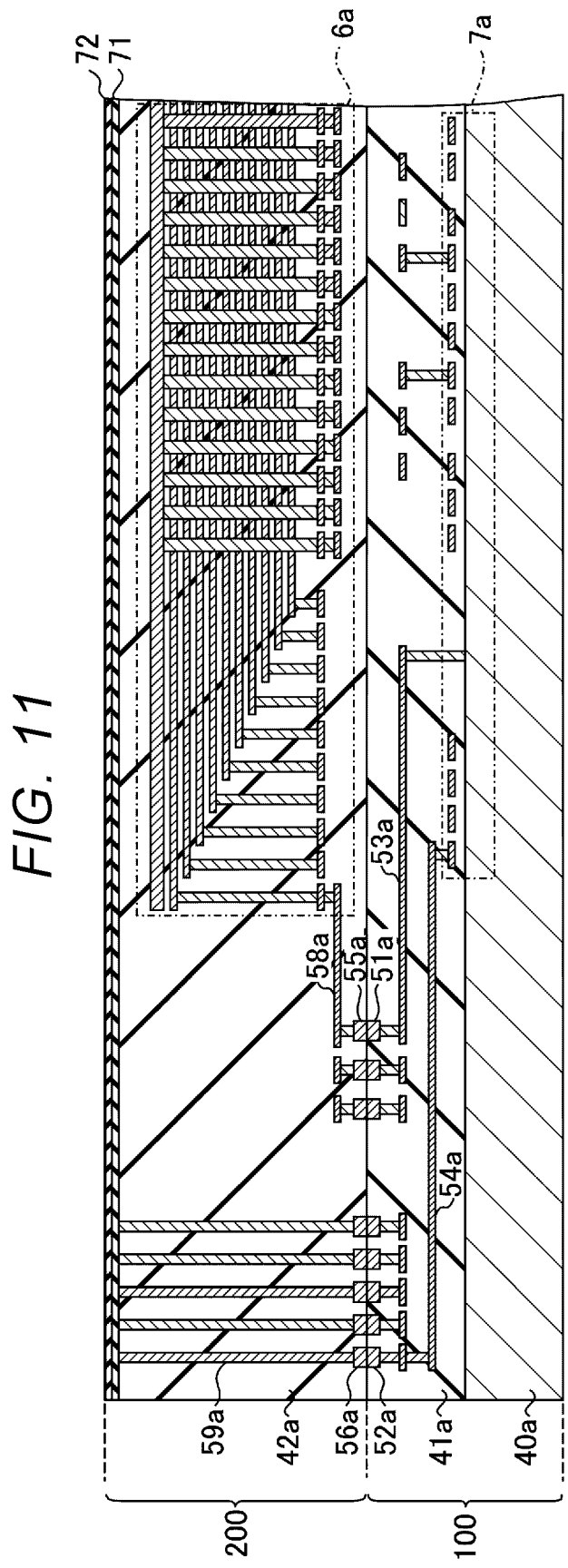
FIG. 11 is a cross-sectional view illustrating the manufacturing step of the memory device according to the first embodiment.

Subsequently, as illustrated in FIG. 11, the peripheral circuit chip 100 and the cell chip 200 are bonded to each other. Specifically, the plurality of electrodes including the electrodes 51a and 52a of the peripheral circuit chip 100 and the plurality of electrodes including the electrodes 55a and 56a of the cell chip 200 are respectively joined. As a joining method, for example, a joining method by mechanical pressure, a joining method by applying an inert plasma process to a joining surface, a joining method using an organic adhesive or the like may be applied.

After the peripheral circuit chip 100 and the cell chip 200 are bonded to each other, the substrate 70 is removed with a chemical solution such as potassium hydroxide (KOH). Thus, the insulator layers in the periphery of the joined electrodes may also be joined to each other.

After removing the substrate 70, the insulator layer 72 is formed on an upper surface of the insulator layer 71. The insulator layer 72 is a layer that generates stress in a reverse direction to warpage generated in the cell chip 200 by removing the substrate 70. The insulator layer 72 contains, for example, silicon nitride. Thus, influence of the warpage generated on the cell chip 200 after the removal of the substrate 70 may be reduced.

Figure 12:
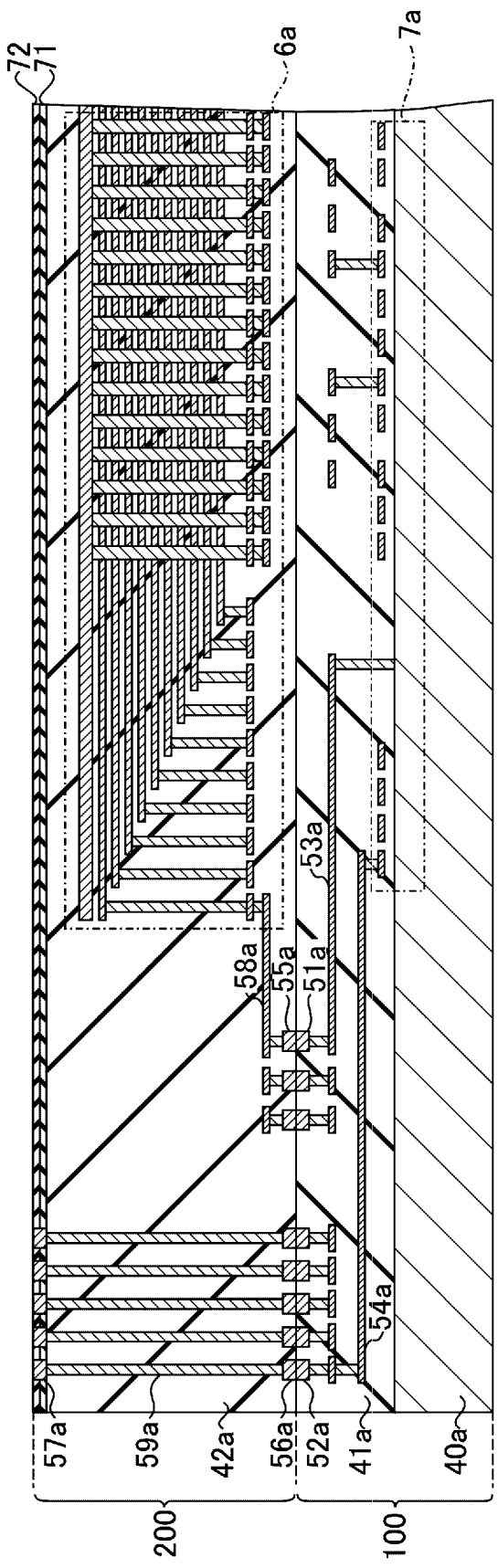
FIG. 12 is a cross-sectional view illustrating the manufacturing step of the memory device according to the first embodiment.

Subsequently, in the insulator layers 71 and 72, a region in which a plurality of electrodes including the electrodes 57a are to be formed is removed, and the plurality of wiring layers including the wiring layer 59a are exposed. As illustrated in FIG. 12, the plurality of electrodes including the electrodes 57a are formed in the region from which the insulator layers 71 and 72 are removed, so as to be respectively and electrically connected to the plurality of wiring layers including the wiring layer 59a.

It is noted that the steps related to the peripheral circuit chip 100 and the cell chip 200 illustrated in FIGS. 11 and 12 are applied to the peripheral circuit chip 400 and the cell chip 300 in the same manner.

That is, the peripheral circuit chip 400 and the cell chip 300 are bonded to each other by a step equivalent to FIG. 11. Specifically, the plurality of electrodes including the electrodes 51b and 52b of the peripheral circuit chip 400 and the plurality of electrodes including the electrodes 55b and 56b of the cell chip 300 are respectively joined.

After the peripheral circuit chip 400 and the cell chip 300 are bonded to each other, a substrate (not illustrated) of the cell chip 300 is removed by a chemical solution such as potassium hydroxide (KOH). After removing the substrate of the cell chip 300, the insulator layer 74 is formed on an upper surface of the insulator layer 73 of the cell chip 300 corresponding to the insulator layer 71. The insulator layer 73 contains, for example, silicon oxide. The insulator layer 74 is a layer that generates stress in a reverse direction to warpage generated in the cell chip 300 by removing the substrate of the cell chip 300. The insulator layer 74 contains, for example, silicon nitride.

Subsequently, in the insulator layers 73 and 74, a region in which the plurality of electrodes including the electrode 57b is to be formed is removed, and a plurality of wiring layers including the wiring layer 59b are exposed. The plurality of electrodes including the electrodes 57b are formed in the region from which the insulator layers 73 and 74 are removed, so as to be respectively and electrically connected to the plurality of wiring layers including the wiring layer 59b by a step equivalent to FIG. 12.

The above steps related to the peripheral circuit chip 400 and the cell chip 300 may be executed in parallel with the steps related to the peripheral circuit chip 100 and the cell chip 200.

Figure 13:
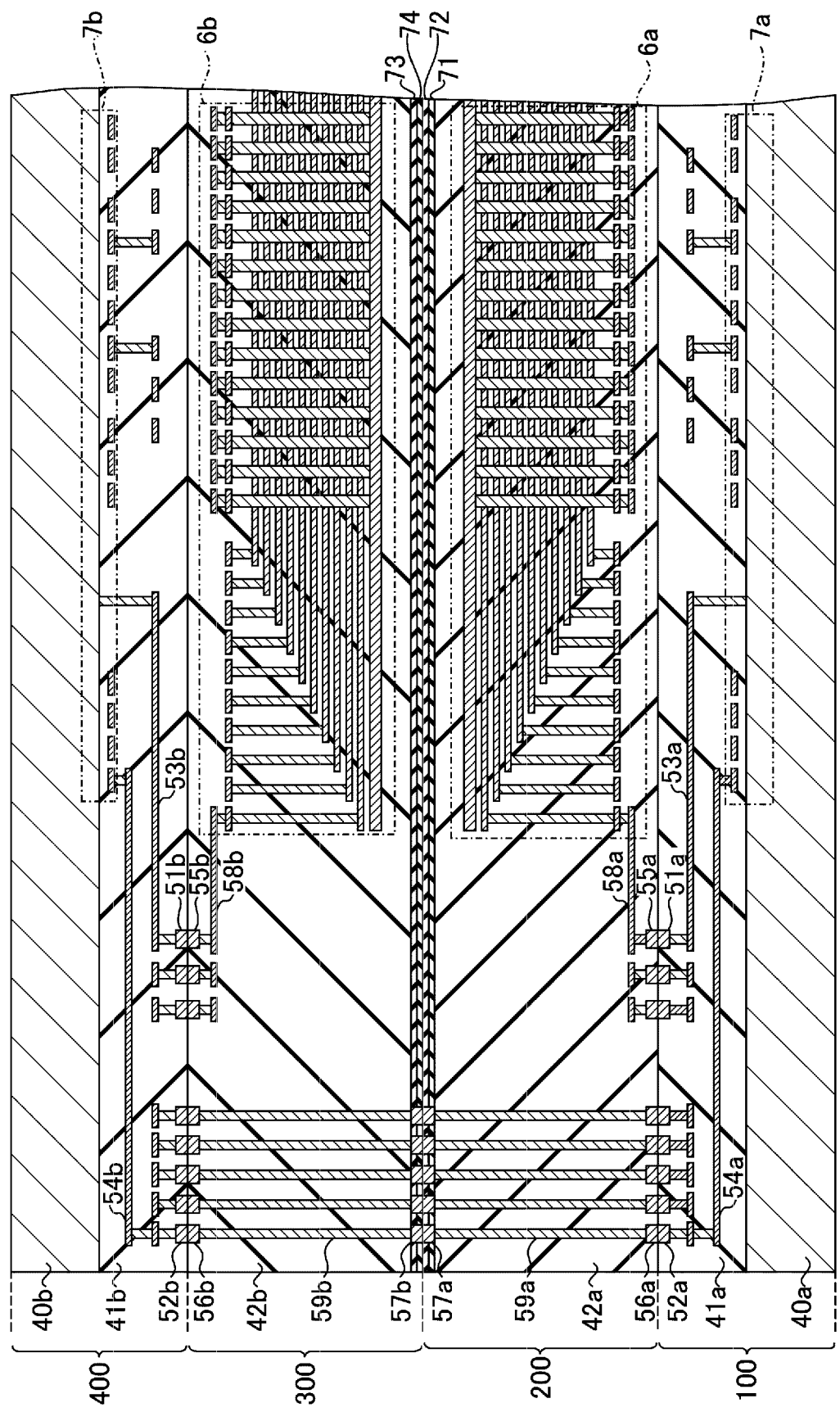
FIG. 13 is a cross-sectional view illustrating the manufacturing step of the memory device according to the first embodiment.

After that, as illustrated in FIG. 13, the cell chip 200 and the cell chip 300 are bonded to each other. A bonding step in FIG. 13 is equivalent to the bonding step in FIG. 11.

Figure 14:
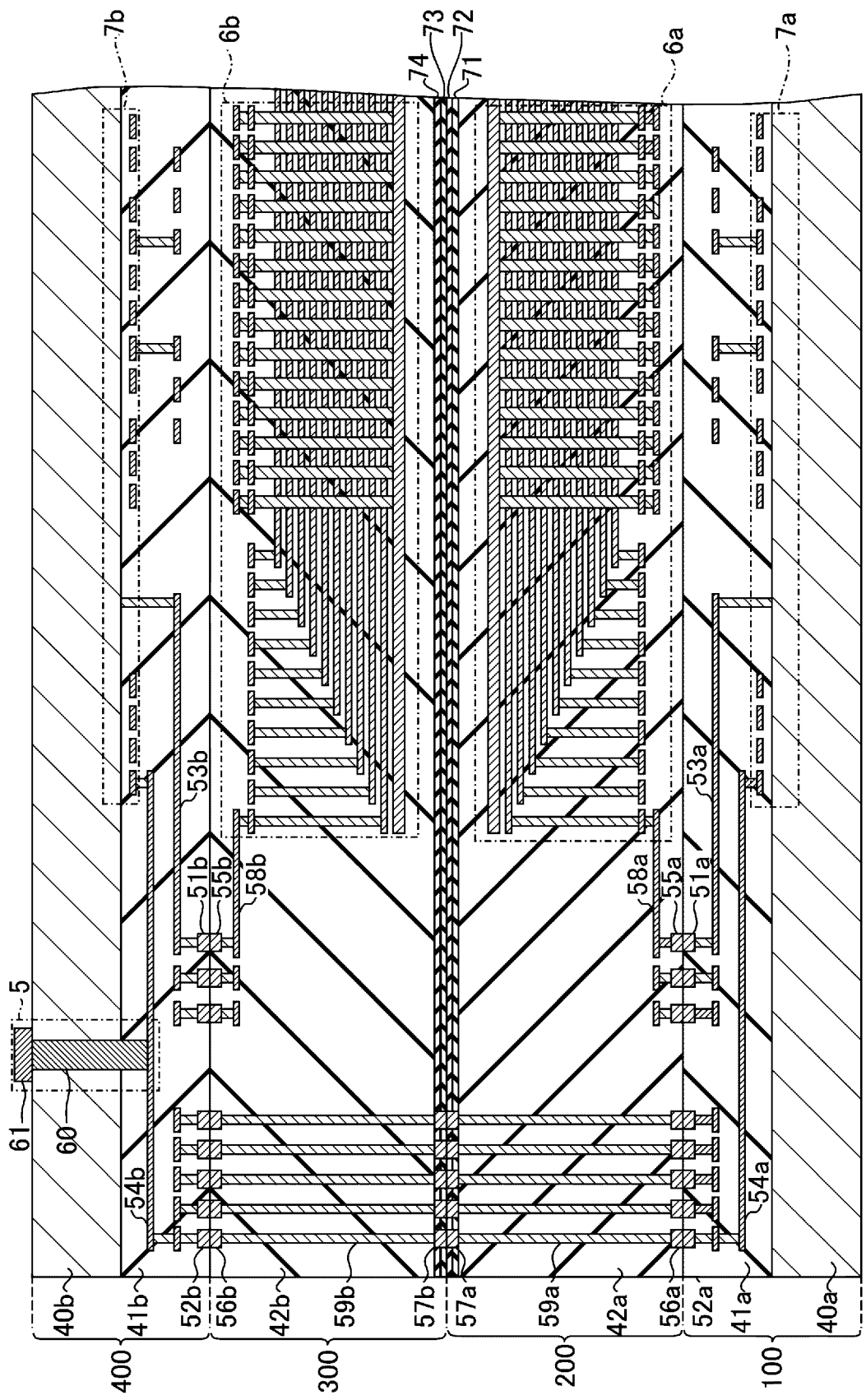
FIG. 14 is a cross-sectional view illustrating the manufacturing step of the memory device according to the first embodiment.

Subsequently, as illustrated in FIG. 14, the pad group 5 is formed. Specifically, in the semiconductor substrate 40b and the insulator layer 41b of the peripheral circuit chip 400, a region in which the contact 60 is to be formed is removed. Thus, the wiring layer 54b to be electrically connected to the electrode 61 is exposed. The contact 60 is formed in the region from which the semiconductor substrate 40b and the insulator layer 41b are removed. The electrode 61 is formed so as to be in contact with an upper surface of the contact 60.

The memory device 3 is formed by the above steps.

1.3 Effect Related to Present Embodiment

According to the first embodiment, the peripheral circuit chip 100 and the cell chip 200 include the semiconductor substrate 40a, the electrode 57a, and the memory cell array 6a provided between the semiconductor substrate 40a and the electrode 57a. The peripheral circuit chip 400 and the cell chip 300 include the semiconductor substrate 40b, the electrode 57b in contact with the electrode 57a, and the memory cell array 6b provided between the semiconductor substrate 40b and the electrode 57b. Thus, the memory device 3 may respectively have one peripheral circuit region PERI at both ends along a chip stack direction. Therefore, as compared with the case the peripheral circuit region PERI is provided only on one side along the chip stack direction, the peripheral circuit region PERI may be increased. Therefore, it is possible to provide the memory device in which a chip size (an area) is not proportionally determined by a size of the peripheral circuit.

Additionally, by increasing the number of stack word lines WL, a memory capacitance per unit area of the chip along the XY plane may be increased. Therefore, the chip size required for the memory device having a certain predetermined memory capacitance may be reduced as the number of stack word lines WL is increased. Meanwhile, the chip size required for the peripheral circuit hardly changes depending on the number of stack word lines WL. Therefore, when the number of stack word lines WL is increased to some extent, the chip size required for the memory device is proportionally determined by the chip size required for the peripheral circuit, and so that a reduction effect by the increase in the number of stack word lines WL may not be expected.

According to the first embodiment, the memory device 3 respectively includes the peripheral circuit chips 100 and 400 at both ends. Thus, the amount of peripheral circuit that may be formed per unit area of the chip may be doubled, as compared with the case where only one peripheral circuit chip is provided. Therefore, it is possible to provide the memory device of which chip size is not proportionally determined by the size of the peripheral circuit.

Further, the four chips 100 to 400 may be formed in parallel. That is, the peripheral circuit 7 and the memory cell array 6 may be formed in parallel. Therefore, a time required for manufacturing the memory device 3 may be shortened, as compared with the case where the memory cell array 6 is formed after the step of forming the peripheral circuit 7.

2. Second Embodiment

A memory device according to a second embodiment is different from the memory device according to the first embodiment in that a thickness of a semiconductor substrate of two peripheral circuit chips is significantly different. In the following, a configuration of the memory device according to the second embodiment different from the configuration of the first embodiment, will be mainly described, and the description of the configuration equivalent to the configuration of the first embodiment will not be repeated.

2.1 Bonding Structure of Memory Device

Figure 15:
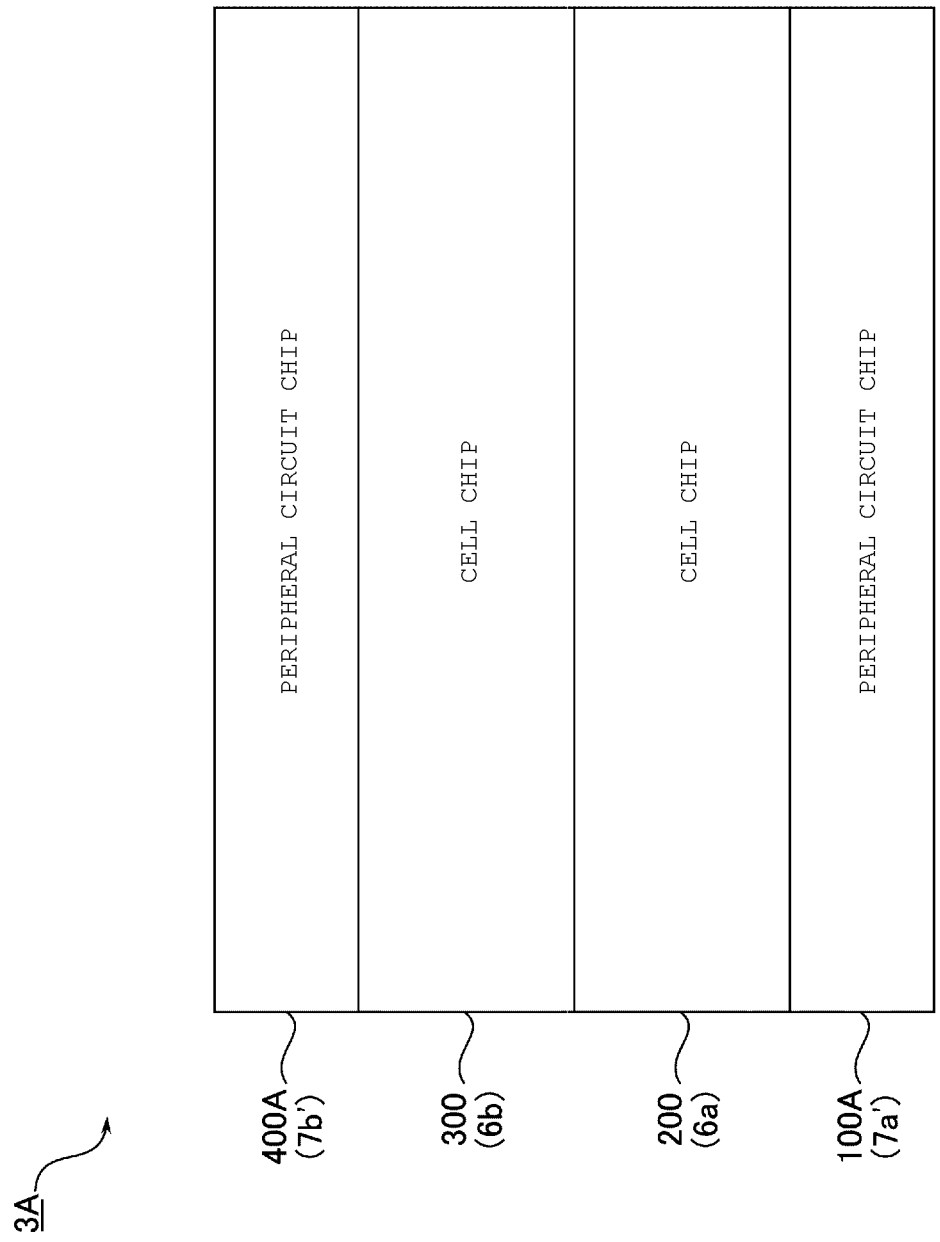
FIG. 15 is a diagram illustrating an example of a bonding structure of a plurality of chips in a memory device according to a second embodiment.

FIG. 15 is a diagram illustrating an example of a bonding structure of a plurality of chips in the memory device according to the second embodiment. FIG. 15 corresponds to FIG. 3 in the first embodiment.

Specifically, a memory device 3A includes peripheral circuit chips 100A and 400A, and the cell chips 200 and 300.

A peripheral circuit 7a' is formed at the peripheral circuit chip 100A. The peripheral circuit 7a' may include the input and output circuit 11, the logic control circuits 12, the command registers 13, the address registers 14, the sequencer 15, the driver module 16, and the row decoder modules 17. A portion that supplies a voltage toward the row decoder module 17 is provided in the driver module 16 formed in the peripheral circuit 7a'.

On the other hand, the pad group 5 and a peripheral circuit 7b' are formed in the peripheral circuit chip 400. The peripheral circuit 7b' may include the input and output circuit 11, the logic control circuit 12, the command register 13, the address register 14, the sequencer 15, the driver module 16, and the sense amplifier module 18. The driver module 16 formed in the peripheral circuit 7b' does not include a portion that supplies a voltage toward the row decoder module 17.

As described above, a circuit group to which a high voltage such as a voltage VPGM is applied is provided in the peripheral circuit chip 100A. On the other hand, the peripheral circuit chip 400A does not include a circuit group to which a high voltage such as the voltage VPGM is applied. The voltage VPGM is a voltage to be applied to the word line WL of the memory cell transistor MT to be written, in the write operation for data. The voltage VPGM may be equal to or more than 20 V, for example.

2.2 Planar Layout of Memory Device

Figure 16:
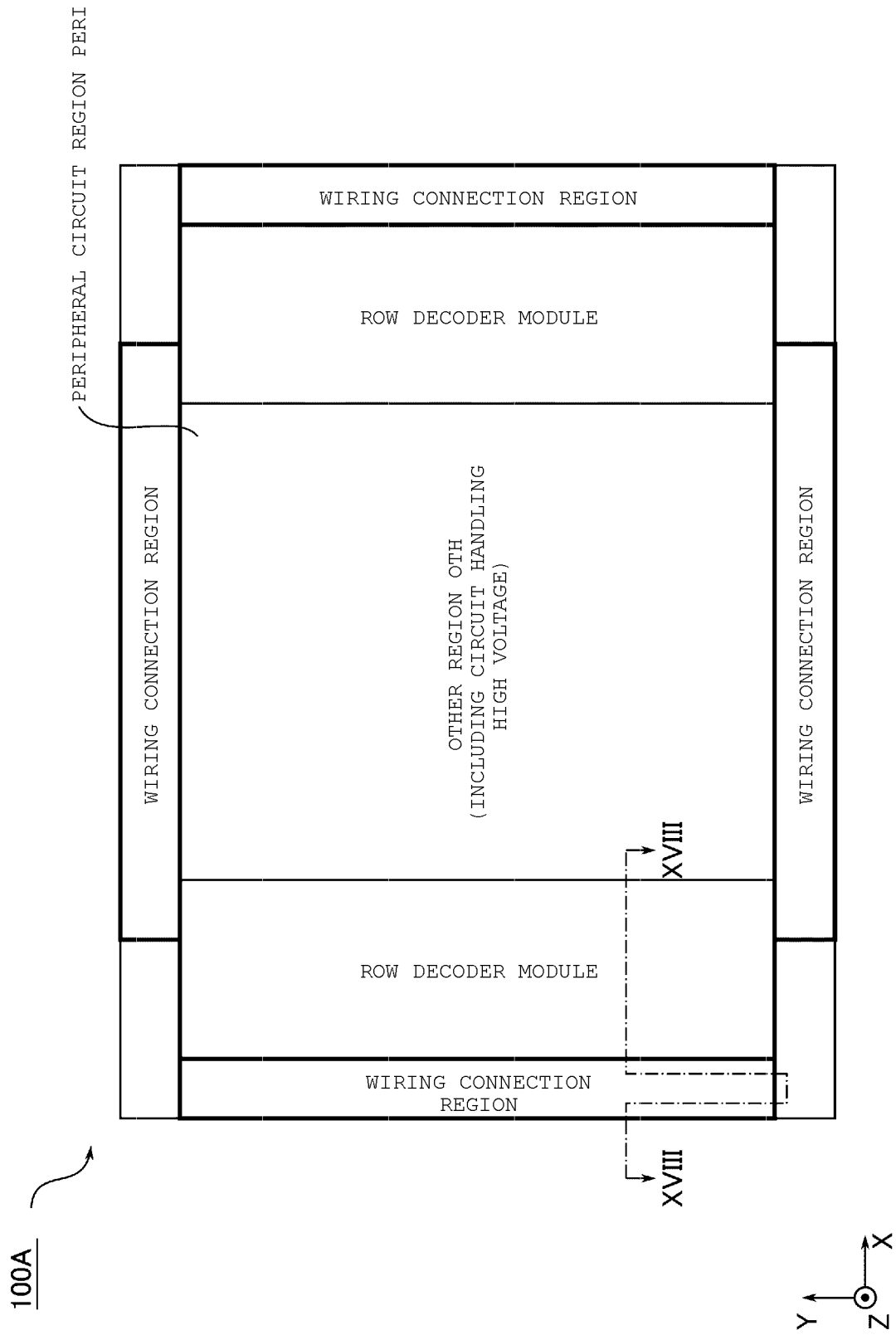
FIG. 16 is a diagram illustrating an example of a planar layout in one of two peripheral circuit chips in the memory device according to the second embodiment.
Figure 17:
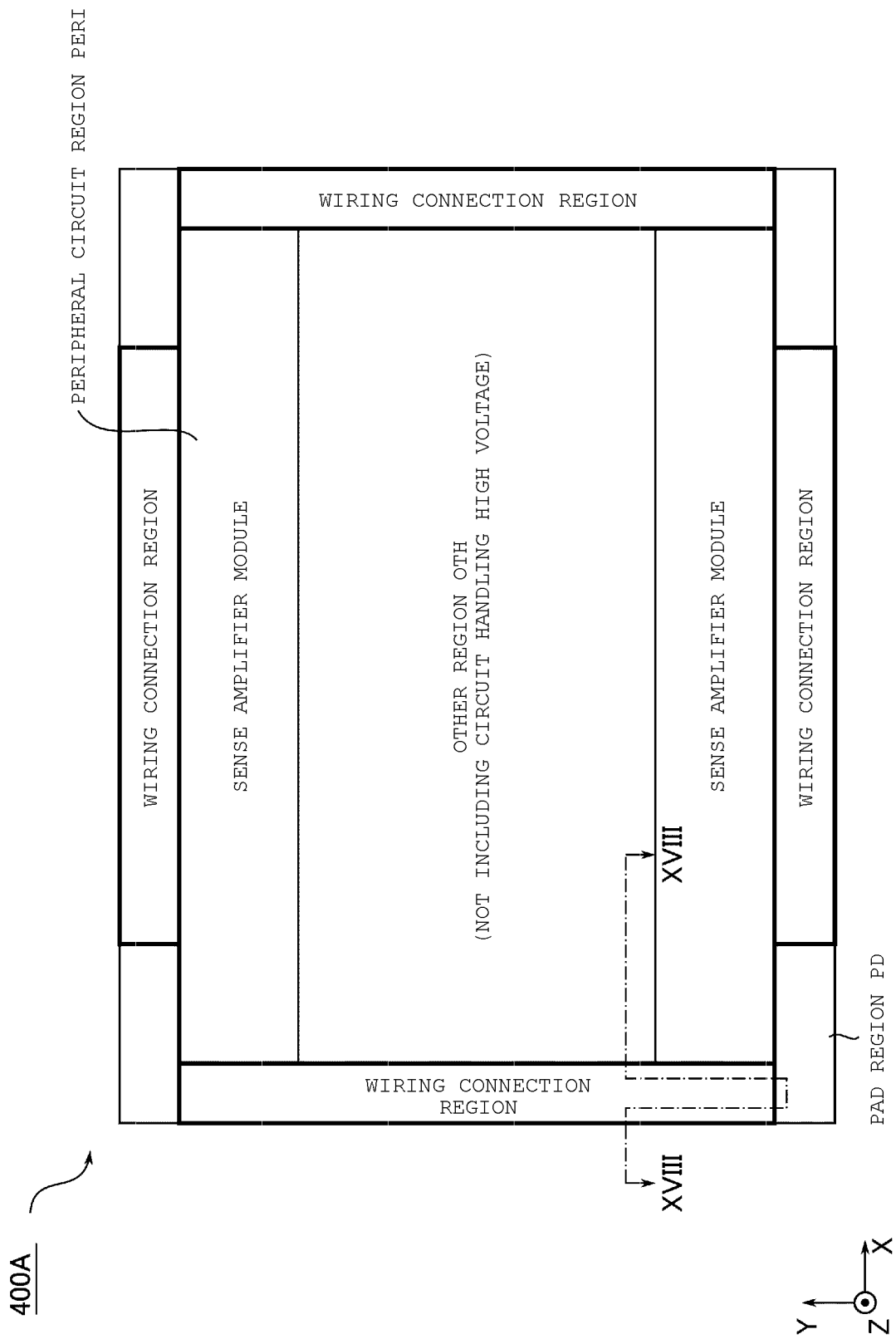
FIG. 17 is a diagram illustrating an example of a planar layout of the other of the two peripheral circuit chips in the memory device according to the second embodiment.

FIGS. 16 and 17 are diagrams illustrating an example of a planar layout of the memory device according to the second embodiment. FIG. 16 illustrates a planar layout of the peripheral circuit chip 100A. FIG. 17 illustrates a planar layout of the peripheral circuit chip 400A. FIGS. 16 and 17 respectively correspond to FIGS. 4 and 6 in the first embodiment.

First, the planar layout of the peripheral circuit chip 100A will be described with reference to FIG. 16.

As illustrated in FIG. 16, the peripheral circuit chip 100A has, for example, the peripheral circuit region PERI and the four wiring connection regions WJCT in the XY plane.

The peripheral circuit region PERI has, for example, the two row decoder regions RD and the other region OTH, and does not have the sense amplifier region SA. A circuit provided in the other region OTH of the peripheral circuit chip 100A includes a circuit that handles a high voltage such as the voltage VPGM.

Next, the planar layout of the peripheral circuit chip 400A will be described with reference to FIG. 17.

As illustrated in FIG. 17, the peripheral circuit chip 400A has, for example, the peripheral circuit region PERI, the four wiring connection regions WJCT, and the pad region PD in the XY plane. Among the peripheral circuit region PERI, the four wiring connection regions WJCT, and the pad region PD, arrangement of the four wiring connection regions WJCT and the pad region PD is equivalent to the peripheral circuit chip 400 in FIG. 6 of the first embodiment, and thus the description thereof will not be repeated.

The peripheral circuit region PERI has, for example, the two sense amplifier regions SA and the other region OTH, and does not have the row decoder region RD. A circuit provided in the other region OTH of the peripheral circuit chip 400A does not include a circuit that handles a high voltage such as the voltage VPGM.

2.3 Cross-Sectional Structure of Memory Device

Figure 18:
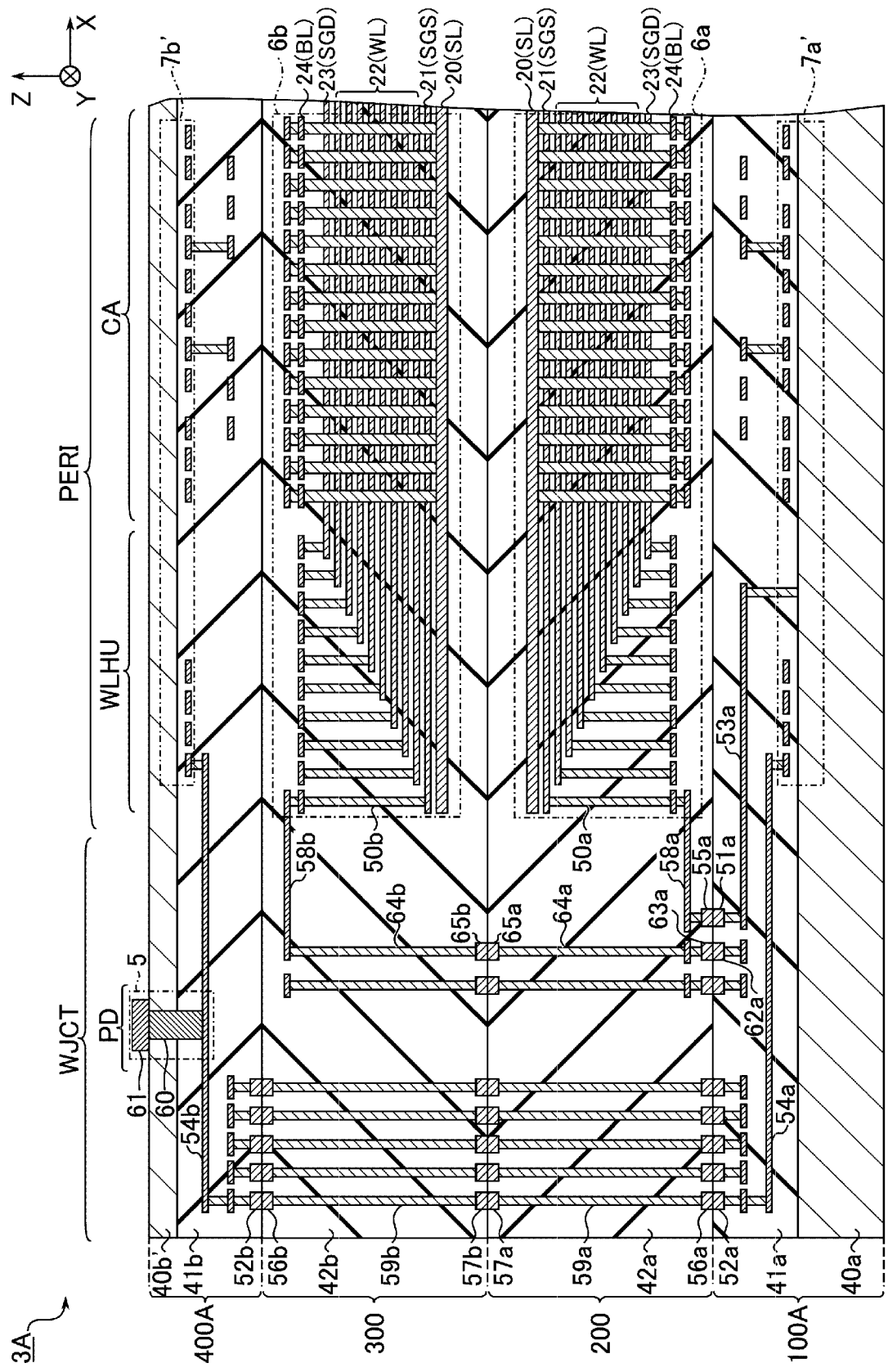
FIG. 18 is a cross-sectional view illustrating an example of a structure of the memory device according to the second embodiment.

FIG. 18 is a cross-sectional view taken along the line XVIII-XVIII in FIGS. 16 and 17, illustrating an example of a structure of the memory device according to the second embodiment. FIG. 18 corresponds to FIG. 7 in the first embodiment.

As illustrated in FIG. 18, the peripheral circuit 7a' is formed in a boundary region between the semiconductor substrate 40a and the insulator layer 41a of the peripheral circuit chip 100. The electrodes 51a and 52a are provided on a second surface of the insulator layer 41a. For example, the row decoder module 17 in the peripheral circuit 7a' is electrically connected to the electrode 51a via the wiring layer 53a and electrically connected to the electrode 62a via a wiring layer (not illustrated).

The electrodes 55a, 56a, and 63a are provided on a first surface of the insulator layer 42a of the cell chip 200. The electrodes 57a and 65a are provided on a second surface of the insulator layer 42a. For example, the electrode 63a is electrically connected to the electrode 65a via the wiring layer 64a.

The electrode 57b and an electrode 65b are provided on a first surface of the insulator layer 42b of the cell chip 300. The electrode 56b is provided on a second surface of the insulator layer 42b. For example, the memory cell array 6b is electrically connected to the electrode 65b via the wiring layer 58b and a wiring layer 64b.

The peripheral circuit chip 400 includes a semiconductor substrate 40b' and the insulator layer 41b. The semiconductor substrate 40b' has a thickness thinner than the semiconductor substrate 40a in the Z-direction. The peripheral circuit 7b' is formed in a boundary region between the semiconductor substrate 40b' and the insulator layer 41b. The electrode 52b is provided on a first surface of the insulator layer 41b. As described above, the row decoder module 17 is not provided in the peripheral circuit 7b'. Therefore, a wiring layer of the word line hookup region WLHU of the cell chip 300 and the peripheral circuit 7b' may not be electrically connected.

The second surface of the insulator layer 41a and the first surface of the insulator layer 42a are bonded so that the corresponding electrodes are in contact with each other. In the example in FIG. 18, the second surface of the insulator layer 41a and the first surface of the insulator layer 42a are bonded so that the electrode 51*a* and the electrode 55*a* are in contact with each other, the electrode 52*a* and the electrode 56*a* are in contact with each other, and the electrode 62*a* and the electrode 63*a* are in contact with each other.

The second surface of the insulator layer 42*a* and the first surface of the insulator layer 42*b* are bonded so that the corresponding electrodes are in contact with each other. In the example in FIG. 18, the second surface of the insulator layer 42*a* and the first surface of the insulator layer 42*b* are bonded so that the electrodes 57*a* and 57*b* are in contact with each other and the electrodes 65*a* and 65*b* are in contact with each other.

The second surface of the insulator layer 42*b* and the first surface of the insulator layer 41*b* are bonded so that the corresponding electrodes are in contact with each other. In the example in FIG. 18, the second surface of the insulator layer 42*b* and the first surface of the insulator layer 41*b* are bonded so that the electrode 56*b* and the electrode 52*b* are in contact with each other.

For both the cell chips 200 and 300, each of the conductor layers 21 to 23 is drawn by a contact extending along the Z-direction, and then electrically connected to the peripheral circuit 7*a*' via the wiring connection region WJCT. In FIG. 18, as an example, the case where the conductor layer 21 of the cell chip 200 and the conductor layer 21 of the cell chip 300 are respectively and electrically connected to the electrodes 55*a* and 62*a* via the contact 50*a* and a contact 50*b* is illustrated. Thus, the peripheral circuit 7*a*' may apply a desired voltage to each of the select gate line SGD, the plurality of word line WL, and the select gate line SGS, in both the memory cell arrays 6*a* and 6*b*. The peripheral circuit 7*b*' does not supply a desired voltage to each of the select gate line SGD, the plurality of word line WL, and the select gate line SGS.

Further, although not illustrated in FIG. 18, in both the cell chips 200 and 300, the conductor layer 24 is drawn by a contact (not illustrated) extending along the Z-direction, and then electrically connected to the peripheral circuit 7*b*' via a wiring connection region (not illustrated). Thus, the peripheral circuit 7*b*' may supply a desired voltage to the bit line BL, in both the memory cell arrays 6*a* and 6*b*. Further, the peripheral circuit 7*a*' does not supply a desired voltage to the bit line BL.

2.2 Effect Related to Present Embodiment

According to the second embodiment, the driver module 16 and the row decoder module 17 that supply a voltage to both the memory cell array 6*a* in the cell chip 200 and the memory cell array 6*b* in the cell chip 300 are formed, in the peripheral circuit chip 100A. That is, circuits to which a high voltage such as the voltage VPGM is applied are integrated in the peripheral circuit chip 100A. Thus, it is possible to avoid forming a circuit to which a high voltage is applied, in the peripheral circuit chip 400A. Therefore, it is possible to avoid forming a deep depletion layer in a film thickness direction (Z-direction) of the semiconductor substrate 40*b*. Therefore, a thickness of the semiconductor substrate 40*b* may be made thinner than a thickness of the semiconductor substrate 40*a*. By reducing the thickness of the semiconductor substrate 40*b*, when forming the pad group 5 (in particular, the contact 60), it is possible to reduce a load for steps of forming a hole penetrating through the semiconductor substrate 40*b*.

3. Modification Example and Like

It is noted that the first embodiment and the second embodiment described above may be modified in various ways.

3.1 First Modification Example

For example, in the first embodiment and the second embodiment described above, the case where the configuration obtained by bonding the peripheral circuit chip 100 and the cell chip 200 and the configuration obtained by bonding the peripheral circuit chip 400 and the cell chip 300 are further bonded, and the embodiment is not limited to this. For example, at least one of the configuration including the peripheral circuit 7*a* and the memory cell array 6*a*, and the configuration including the peripheral circuit 7*b* and the memory cell array 6*b* may be configured with a single chip. In the following description, a configuration different from the configuration of the first embodiment will be mainly described, and description of a configuration equivalent to the configuration of the first embodiment will not be repeated.

3.1.1 First Example

Figure 19:
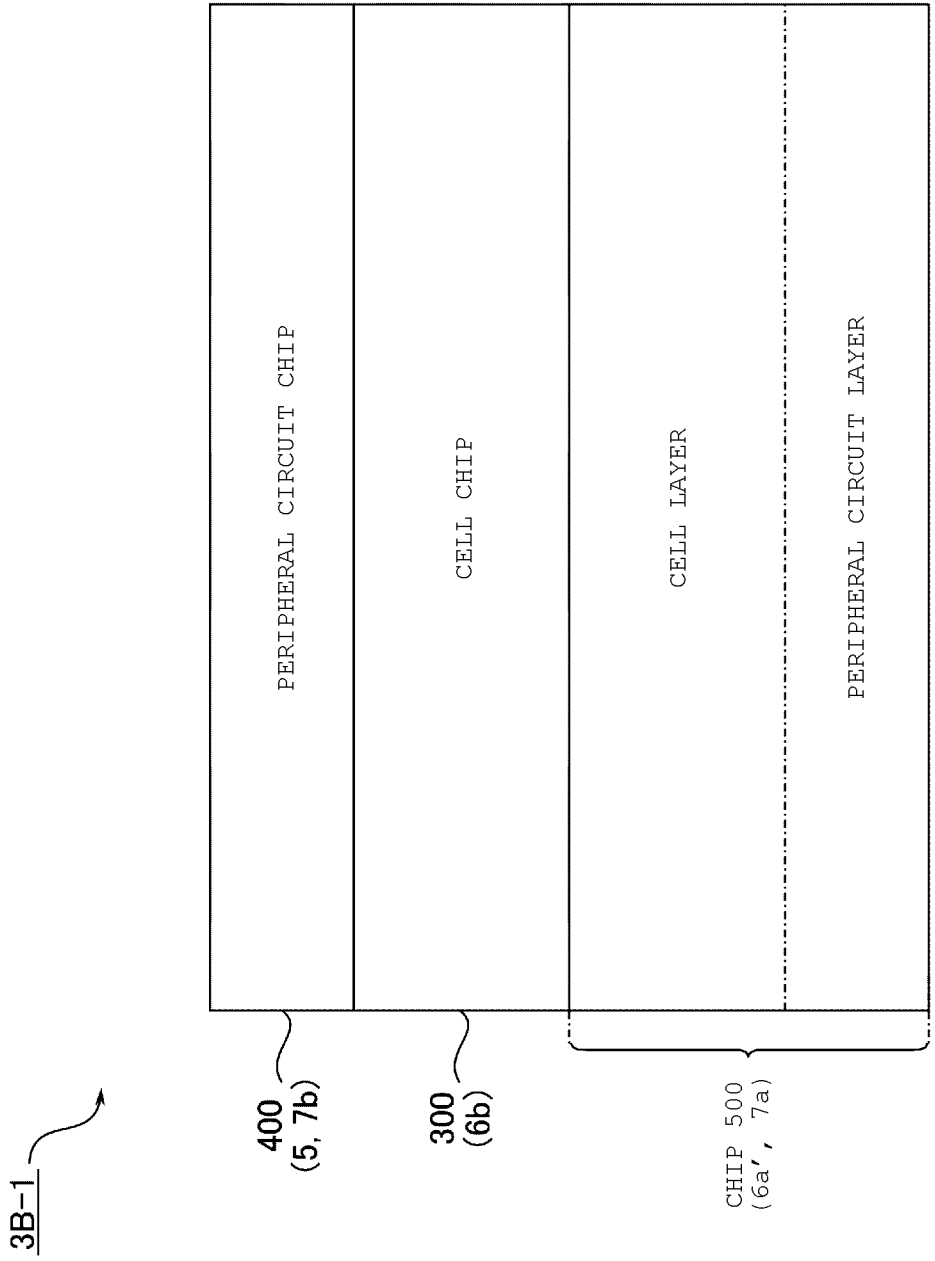
FIG. 19 is a diagram illustrating an example of a bonding structure of a plurality of chips in a memory device according to a first example of a first modification example.

FIG. 19 is a diagram illustrating an example of a bonding structure of a plurality of chips in a memory device according to a first example of a first modification example. FIG. 19 corresponds to FIG. 3 in the first embodiment.

As illustrated in FIG. 19, a memory device 3B-1 is bonded so that three chips are stacked. Specifically, the memory device 3B-1 includes the cell chip 300, the peripheral circuit chip 400, and a chip 500. The chip 500 includes a peripheral circuit layer on which the peripheral circuit 7*a* is formed and a cell layer on which a memory cell array 6*a*' is formed.

Each of the cell chip 300, the peripheral circuit chip 400, and the chip 500 has a first surface and a second surface facing each other. The first surface of the chip 500 is not in contact with any of the chips. The second surface of the chip 500 and the first surface of the cell chip 300 are in contact with each other by being bonded to each other. The second surface of the cell chip 300 and the first surface of the peripheral circuit chip 400 are in contact with each other by being bonded to each other. The second surface of the peripheral circuit chip 400 is not in contact with any of the chips.

Figure 20:
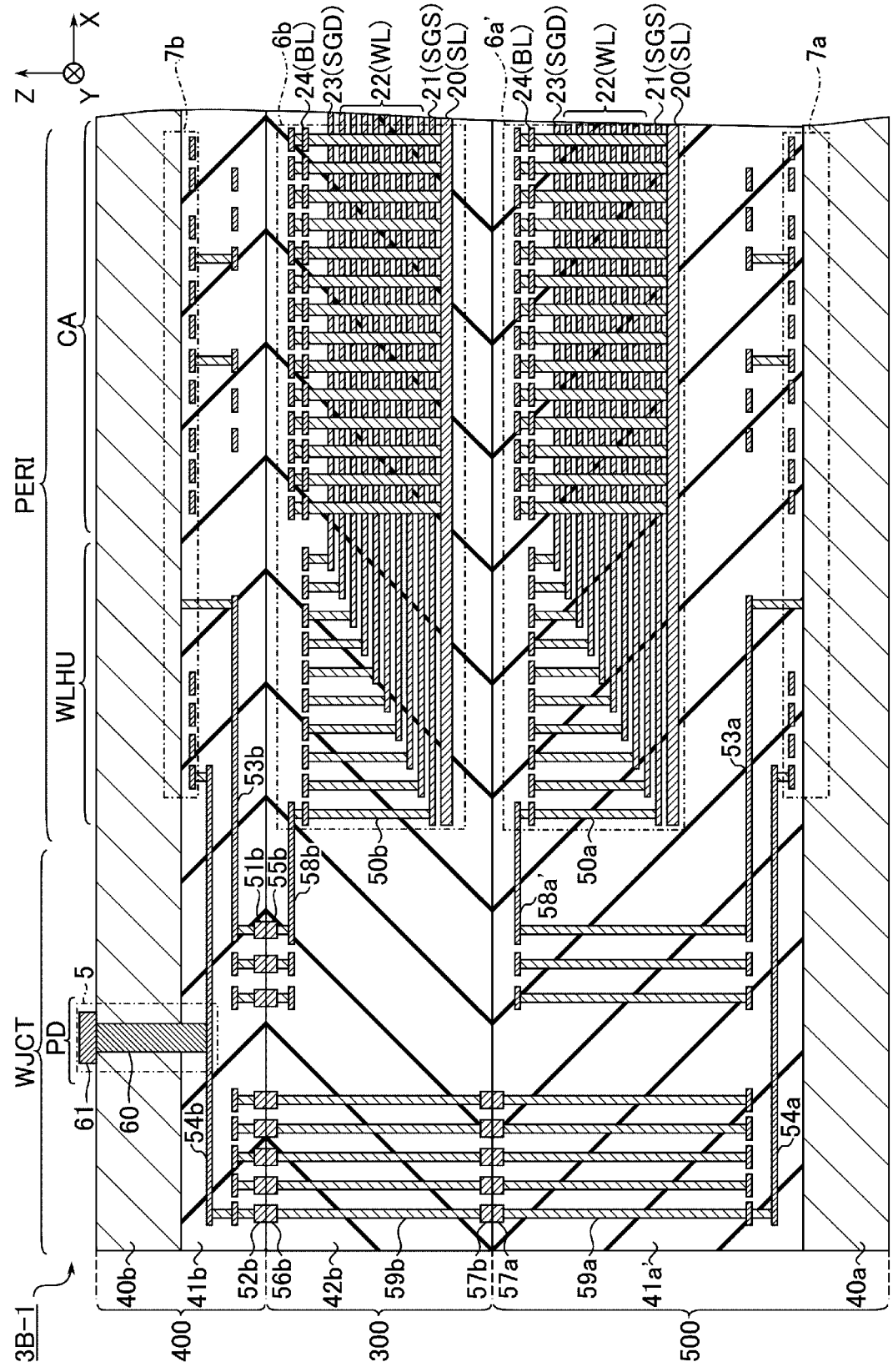
FIG. 20 is a cross-sectional view illustrating an example of a structure of the memory device according to the first example of the first modification example.

FIG. 20 is a cross-sectional view illustrating an example of a structure of the memory device according to the first example of the first modification example. FIG. 20 corresponds to FIG. 7 in the first embodiment.

As illustrated in FIG. 20, the chip 500 includes the semiconductor substrate 40*a* and an insulator layer 41*a*'. A first surface of the semiconductor substrate 40*a* corresponds to the first surface of the chip 500. A second surface of the semiconductor substrate 40*a* and a first surface of the insulator layer 41*a*' are in contact with each other. A second surface of the insulator layer 41*a*' corresponds to the second surface of the chip 500. The electrode 57*a* is provided on the second surface of the insulator layer 41*a*'.

The peripheral circuit 7*a* is formed in a boundary region between the semiconductor substrate 40*a* and the insulator layer 41*a*'. The memory cell array 6*a*' is formed in the insulator layer 41*a*'. The memory cell array 6*a*' is formed so that the conductor layers 20, 21, 22, 23, and 24 are stacked in this order, along the Z-direction. For example, the conductor layer 21 of the memory cell array 6*a*' is drawn out in an upward direction on page along the Z-direction than the conductor layer 24. Thus, the conductor layer 21 of the memory cell array 6a' is electrically connected to a wiring layer 58a' located in an upward direction on page than the conductor layer 24 via the contact 50a.

The row decoder module 17 in the peripheral circuit 7a is electrically connected to the conductor layer 21 of a memory cell array 6b' via the wiring layers 53a and 58a'. Further, for example, the input and output circuit 11 or the logic control circuit 12 in the peripheral circuit 7a is electrically connected to the electrode 57a via the wiring layers 54a and 59a.

As described above, in the first example of the first modification example, the peripheral circuit 7a and the memory cell array 6a' are formed on the same chip 500. The peripheral circuit chip 400 at which the peripheral circuit 7b is formed and the cell chip 300 at which the memory cell array 6b is formed are bonded to each other. The chip 500 and the cell chip 300 bonded to the peripheral circuit chip 400 are further bonded. In this case, both the memory cell arrays 6a' and 6b have the configuration in which the conductor layers 20 to 24 are stacked in this order along the Z-direction. Even in such a configuration, in the same manner as in the first embodiment, the peripheral circuit may be divided and formed on the two semiconductor substrates 40a and 40b. Therefore, an area required for the peripheral circuit may be reduced as compared with the case where the peripheral circuit is formed on one semiconductor substrate.

3.1.2 Second Example

Figure 21:
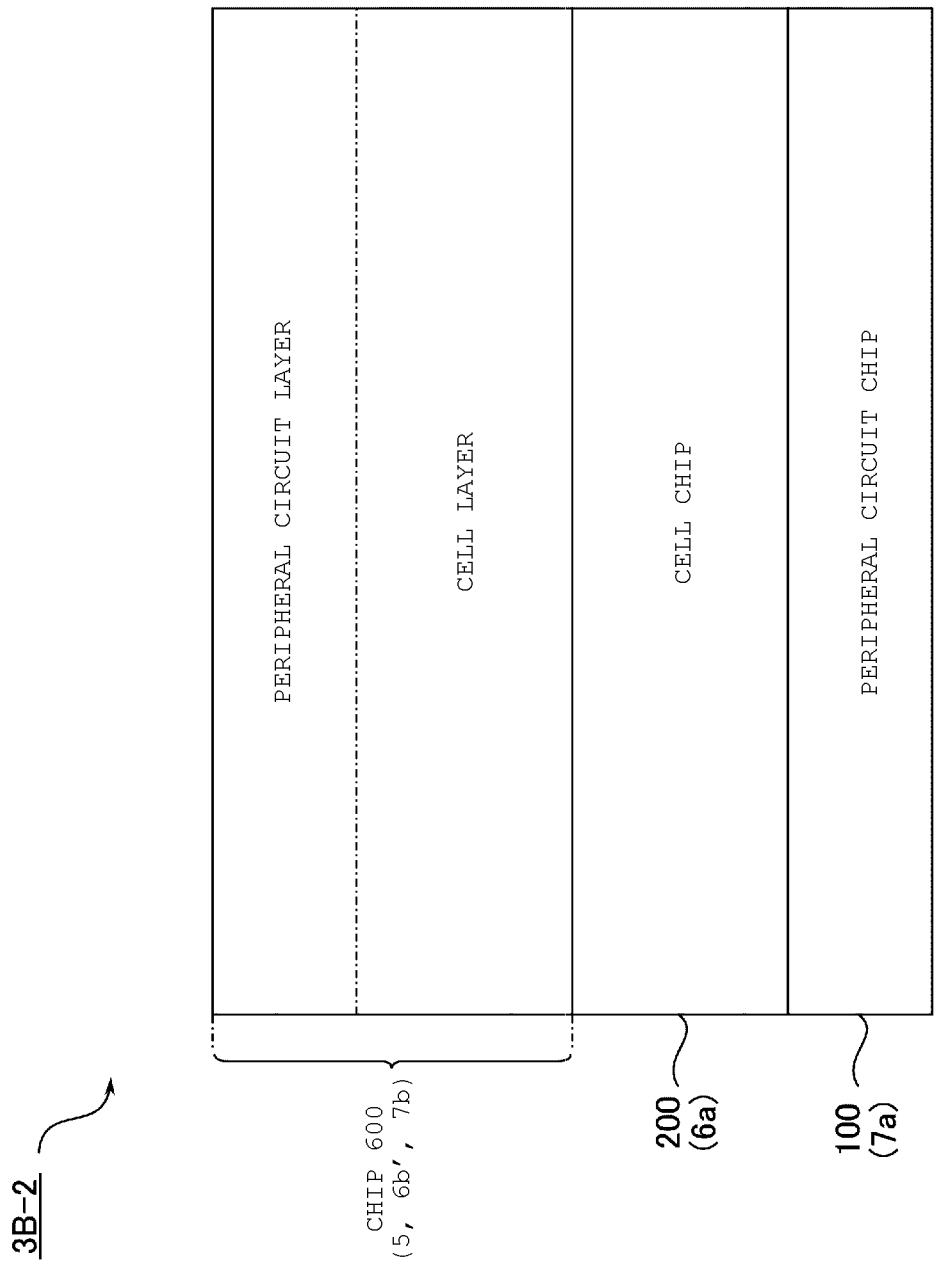
FIG. 21 is a diagram illustrating an example of a bonding structure of a plurality of chips in a memory device according to a second example of the first modification example.

FIG. 21 is a diagram illustrating an example of a bonding structure of a plurality of chips in a memory device according to a second example of the first modification example. FIG. 21 corresponds to FIG. 3 in the first embodiment.

As illustrated in FIG. 21, a memory device 3B-2 is bonded so that three chips are stacked. Specifically, the memory device 3B-2 includes the peripheral circuit chip 100, the cell chip 200, and a chip 600. The chip 600 includes a peripheral circuit layer on which the pad group 5 and the peripheral circuit 7b are formed, and a cell layer on which the memory cell array 6b' is formed.

Each of the peripheral circuit chip 100, the cell chip 200, and the chip 600 has a first surface and a second surface facing each other. The first surface of the peripheral circuit chip 100 is not in contact with any of the chips. The second surface of the peripheral circuit chip 100 and the first surface of the cell chip 200 are in contact with each other by being bonded to each other. The second surface of the cell chip 200 and the first surface of the chip 600 are in contact with each other by being bonded to each other. The second surface of the chip 600 is not in contact with any of the chips.

Figure 22:
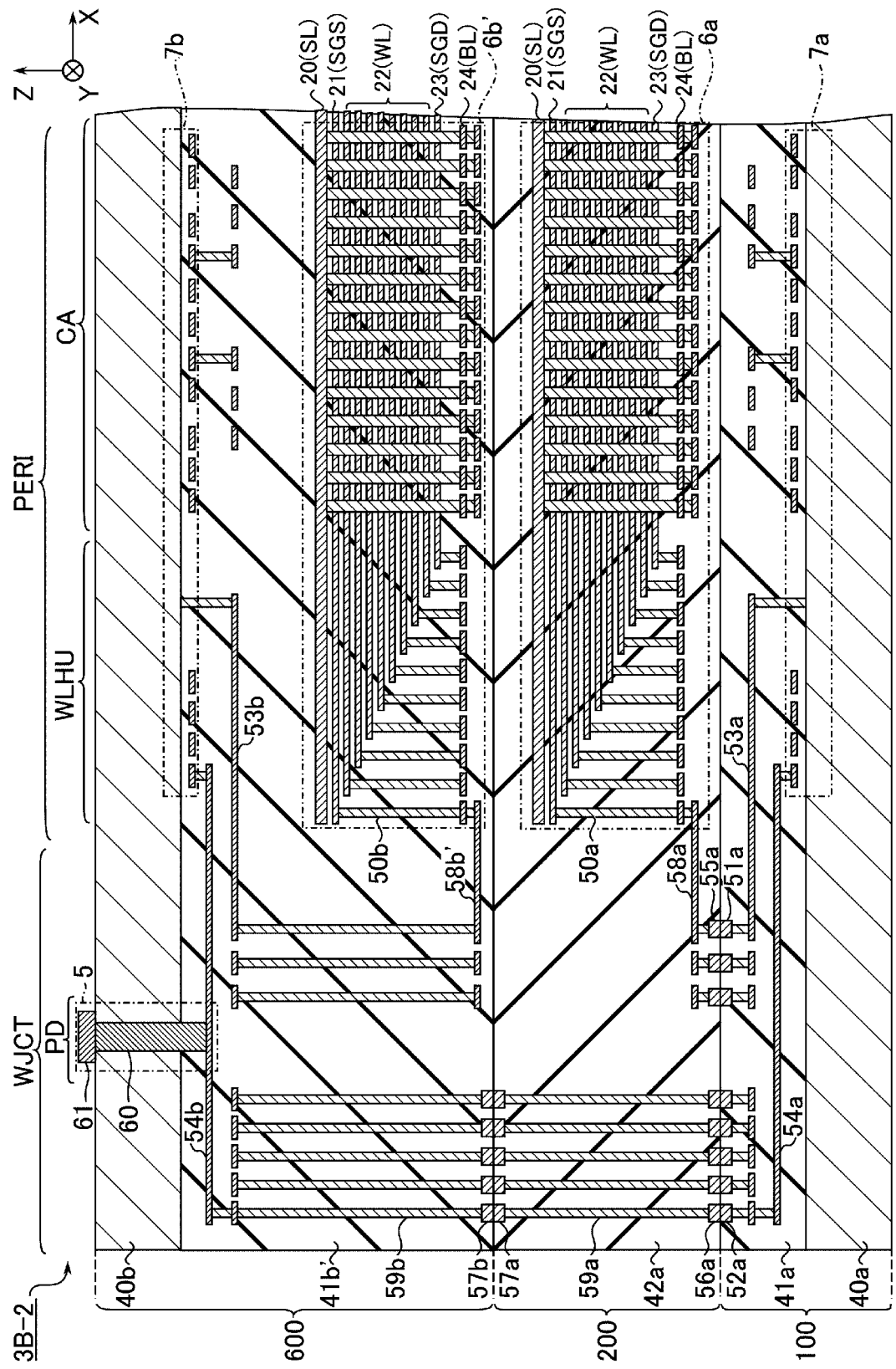
FIG. 22 is a cross-sectional view illustrating an example of a structure of the memory device according to the second example of the first modification example.

FIG. 22 is a cross-sectional view illustrating an example of a structure of the memory device according to the second example of the first modification example. FIG. 22 corresponds to FIG. 7 in the first embodiment.

As illustrated in FIG. 22, the chip 600 includes the semiconductor substrate 40b and an insulator layer 41b'. A first surface of the insulator layer 41b' corresponds to the first surface of the chip 600. A second surface of the insulator layer 41b' and a first surface of the semiconductor substrate 40a are in contact with each other. A second surface of the semiconductor substrate 40b corresponds to the second surface of the chip 600. The electrode 57b is provided on the first surface of the insulator layer 41b'.

The peripheral circuit 7b is formed in a boundary region between the semiconductor substrate 40b and the insulator layer 41b'. The memory cell array 6b' is formed in the insulator layer 41b'. The memory cell array 6b' is formed so that the conductor layers 24, 23, 22, 21, and 20 are stacked in this order along the Z-direction. For example, the conductor layer 21 of the memory cell array 6b' is drawn out in a downward direction on page along the Z-direction with respect to the conductor layer 24. Thus, the conductor layer 21 of the memory cell array 6b' is electrically connected to a wiring layer 58b' located in a downward direction on page than the conductor layer 24 via the contact 50b.

The row decoder module 17 in the peripheral circuit 7b is electrically connected to the conductor layer 21 of the memory cell array 6b' via the wiring layers 53b and 58b'. Further, for example, the input and output circuit 11 or the logic control circuit 12 in the peripheral circuit 7b is electrically connected to the electrode 57b via the wiring layers 54b and 59b.

As described above, in the second example of the first modification example, the peripheral circuit 7b and the memory cell array 6b' are formed on the same chip 600. The peripheral circuit chip 100 at which the peripheral circuit 7a is formed and the cell chip 200 at which the memory cell array 6a is formed are bonded to each other. The chip 600 and the cell chip 200 bonded to the peripheral circuit chip 100 are further bonded. In this case, both the memory cell arrays 6a and 6b' have the configuration in which the conductor layers 24 to 20 are stacked in this order along the Z-direction. Even in such a configuration, in the same manner as in the first embodiment, the peripheral circuit may be divided and formed on the two semiconductor substrates 40a and 40b. Therefore, an area required for the peripheral circuit may be reduced as compared with the case where the peripheral circuit is formed on one semiconductor substrate.

3.2 Second Modification Example

Further, for example, in the first embodiment and the second embodiment described above, the case where the cell chips 200 and 300 are provided between the peripheral circuit chips 100 and 400 is described, and the embodiment is not limited to this. For example, three or more cell chips may be provided between the peripheral circuit chips 100 and 400. In the following description, a configuration different from the configuration of the first embodiment will be mainly described, and description of a configuration equivalent to the configuration of the first embodiment will not be repeated.

FIG. 23 is a diagram illustrating an example of a bonding structure of a plurality of chips in a memory device according to the second modification example. FIG. 23 corresponds to FIG. 3 in the first embodiment.

As illustrated in FIG. 23, a memory device 3C is bonded so that two peripheral circuit chips and three cell chips are stacked. Specifically, the memory device 3C includes the peripheral circuit chips 100 and 400, the cell chips 200 and 300, and a cell chip 700. The memory cell arrays 6a, 6b, and 6c are respectively formed in the cell chips 200, 300, and 700. The peripheral circuit 7a and a peripheral circuit 7c-1 corresponding to the memory cell arrays 6a and 6c are formed in the peripheral circuit chip 100. The pad group 5, and the peripheral circuit 7b and a peripheral circuit 7c-2 corresponding to the memory cell arrays 6b and 6c are formed in the peripheral circuit chip 400.

Each of the peripheral circuit chips 100 and 400, and the cell chips 200, 300, and 700 has a first surface and a second surface facing each other. The first surface of the peripheral circuit chip 100 is not in contact with any of the chips. The second surface of the peripheral circuit chip 100 and the first surface of the cell chip 200 are in contact with each other by being bonded to each other. The second surface of the cell chip 200 and the first surface of the cell chip 700 are in contact with each other by being bonded to each other. The second surface of the cell chip 700 and the first surface of the cell chip 300 are in contact with each other by being bonded to each other. The second surface of the cell chip 300 and the first surface of the peripheral circuit chip 400 are in contact with each other by being bonded to each other. The second surface of the peripheral circuit chip 400 is not in contact with any of the chips.

As described above, in the second modification example, the three or more cell chips are provided between the two peripheral circuit chips. Even in such a configuration, in the same manner as in the first embodiment, the peripheral circuit may be divided and formed on the two semiconductor substrates 40a and 40b. Therefore, an area required for the peripheral circuit may be reduced as compared with the case where the peripheral circuit is formed on one semiconductor substrate. Further, the memory cell arrays are formed in the three or more cell chips by manufacturing steps different from each other. Thus, a memory size may be increased without excessively increasing the number of stacks in the word line WL of the memory cell array formed in one cell chip. Therefore, it is possible to reduce an increase in a manufacturing load due to the increase in the number of stacks.

3.3 Others

In each of the above embodiments, the configuration in which the three or more chips are bonded to each other is described, and the present embodiment is not limited to this. For example, a chip (for example, the chip 500) in which the memory cell array 6a is formed above the semiconductor substrate 40a and a chip (for example, the chip 600) in which the memory cell array 6b is formed above the semiconductor substrate 40b may be bonded to each other.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory device comprising:
    a first chip; and
    a second chip bonded to the first chip,
    wherein the first chip includes a first substrate, a first circuit provided on the first substrate, a first electrode facing a bonding surface of the first chip and the second chip with the first electrode electrically connected to the first circuit, and a first memory cell array provided between the first substrate and the first electrode and electrically connected to the first circuit, and
    the second chip includes a second substrate, a second circuit provided on the second substrate, a second electrode facing the bonding surface with the second electrode electrically connected to the second circuit and being in contact with the first electrode, and a second memory cell array provided between the second substrate and the second electrode with the second memory cell array electrically connected to the second circuit.

2. The memory device according to claim 1,
    wherein the first memory cell array includes
        a first conductor layer,
        a first semiconductor film extending in the first conductor layer along a first direction, and
        a first charge storage film provided between the first conductor layer and the first semiconductor film,
    the second memory cell array includes
        a second conductor layer,
        a second semiconductor film extending in the second conductor layer along the first direction, and
        a second charge storage film provided between the second conductor layer and the second semiconductor film,
    wherein the first direction intersects a facing between the first substrate and the second substrate.

3. The memory device according to claim 2,
    wherein the first chip includes a first row decoder configured to be electrically connected to the first conductor layer, and
    the second chip includes a second row decoder configured to be electrically connected to the second conductor layer.

4. The memory device according to claim 3,
    wherein, along the first direction, a thickness of the first substrate is equal to a thickness of the second substrate.

5. The memory device according to claim 2,
    wherein the first chip includes a first row decoder configured to be electrically connected to the first conductor layer, and a second row decoder configured to be electrically connected to the second conductor layer.

6. The memory device according to claim 5,
    wherein, along the first direction, a thickness of the first substrate is greater than a thickness of the second substrate.

7. The memory device according to claim 1,
    wherein the second substrate has a first surface facing the first substrate and a second surface located on an opposite side of the second substrate, and
    the second chip includes a pad provided on the second surface.

8. The memory device according to claim 1,
    wherein the first chip includes
        a first sub-chip including the first substrate, and
        a second sub-chip provided on the first sub-chip and including the first memory cell array and the first electrode.

9. The memory device according to claim 8,
    wherein the second chip includes
        a third sub-chip provided on the second sub-chip and including the second memory cell array and the second electrode, and
        a fourth sub-chip provided on the third sub-chip and including the second substrate.

10. The memory device according to claim 1,
    wherein the first chip includes
        a first sub-chip including the first substrate,
        a second sub-chip provided above the first sub-chip and including the first memory cell array and the first electrode, and
        a fifth sub-chip provided between the first sub-chip and the second sub-chip and including a third memory cell array.

11. The memory device according to claim 1,
wherein the first electrode and the second electrode include copper.

12. The memory device according to claim 7,
wherein the pad includes aluminum.

13. The memory device according to claim 1,
wherein the first chip includes one or more first insulator layers through which the first electrode extends, and wherein the second chip includes one or more second insulator layers through which the second electrode extends.

14. The memory device according to claim 13,
wherein one of the first insulator layers is in contact with one of the second insulator layers.

15. A method, comprising:
providing a first chip including a first substrate, a first circuit provided on the first substrate, a first electrode, and a first memory cell array;
providing a second chip including a second substrate, a second circuit provided on the second substrate, a second electrode, and a second memory cell array; and
bonding the first chip to the second chip through the first and second electrodes, such that the one or more first decoders are coupled to the first memory cell array, the first electrode faces a bonding surface of the first chip and the second chip with the first electrode electrically connected to the first circuit, the first memory cell array is provided between the first substrate and the first electrode and electrically connected to the first circuit, the second electrode faces the bonding surface with the second electrode electrically connected to the second circuit and being in contact with the first electrode, and the second memory cell array is provided between the second substrate and the second electrode and electrically connected to the second circuit.

16. The method of claim 15, wherein a thickness of the first substrate is equal to a thickness of the second substrate.

17. The method of claim 15, wherein the first circuit and the second circuit each include a decoder.

* * * * *